US 6,724,264 B2

(12) United States Patent
Kondoh

(10) Patent No.: US 6,724,264 B2
(45) Date of Patent: Apr. 20, 2004

(54) CONTROLLER FOR A DEVICE WITH CHANGE IN CHARACTERISTICS

(75) Inventor: Hitoshi Kondoh, Atsugi (JP)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 09/741,360

(22) Filed: Dec. 19, 2000

(65) Prior Publication Data

US 2001/0038316 A1 Nov. 8, 2001

(30) Foreign Application Priority Data

Dec. 22, 1999 (JP) .......................................... 11-364768

(51) Int. Cl.$^7$ ............................................. H03L 7/093
(52) U.S. Cl. ......................... 331/17; 331/1 A; 331/25; 700/14; 700/28; 700/31; 700/44; 700/45
(58) Field of Search .................... 331/1 A, 17, 25; 700/14, 28, 31, 44, 45

(56) References Cited

U.S. PATENT DOCUMENTS

| 2,874,906 A | 2/1959 | Nossen |
| 4,349,868 A | 9/1982 | Brown |
| 4,433,308 A | * 2/1984 | Hirata ........................... 331/17 |
| 4,855,683 A | 8/1989 | Troudet et al. |
| 5,036,294 A | 7/1991 | McCaslin .................... 331/1 A |
| 5,128,625 A | 7/1992 | Yatsuzuka et al. |
| 5,241,285 A | 8/1993 | Jackson ....................... 331/1 A |
| 5,245,528 A | 9/1993 | Saito et al. |
| 5,420,545 A | 5/1995 | Davis et al. |
| 5,450,447 A | 9/1995 | Dutta |
| 5,808,573 A | 9/1998 | Shih et al. |
| 6,473,478 B1 | * 10/2002 | Wallberg et al. ............. 375/376 |

FOREIGN PATENT DOCUMENTS

WO    WO 99/27425    6/1999

OTHER PUBLICATIONS

"High–Speed PLL and Frequency Synthesizer for Low Frequencies", by Kobayashi et al., IEEE Transactions on Circuits and Systems, vol. 31, Oct. 1984.

"Efficient Digital Techniques for Implementing a Class of Fast Phase–Locked Loops (PLL's)" by Kobayashi et al., IEEE Transactions on Industrial Electronics, vol. 41, Dec. 1986.

* cited by examiner

Primary Examiner—Arnold Kinkead
(74) Attorney, Agent, or Firm—W. Daniel Swayze, Jr.; W. James Brady; Frederick J. Telecky, Jr.

(57) ABSTRACT

A device characteristic changing apparatus is provided for changing a characteristic of a device. The device characteristic changing apparatus comprises a time scale generator unit for generating a time scale on which a device operates, and a time scale changing unit for changing the time scale, so that a characteristic of a device is changed by changing the time scale on which the device operates.

31 Claims, 21 Drawing Sheets

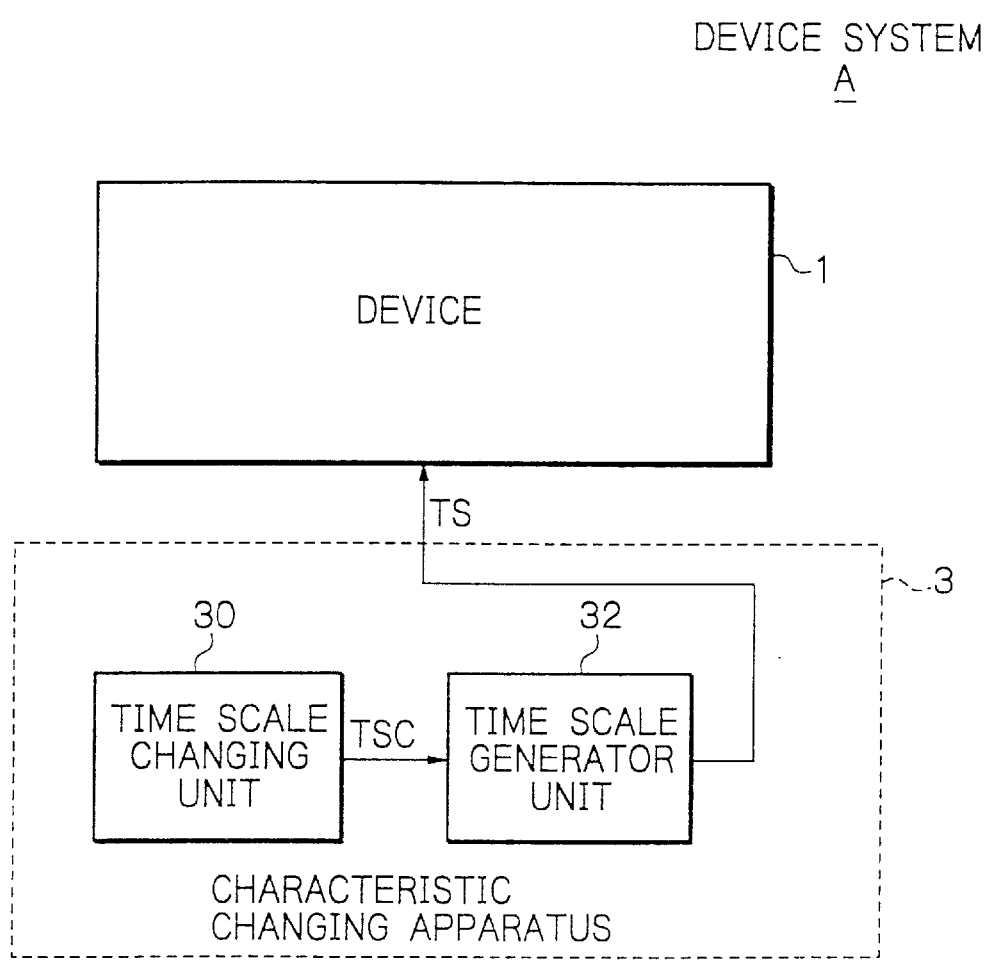

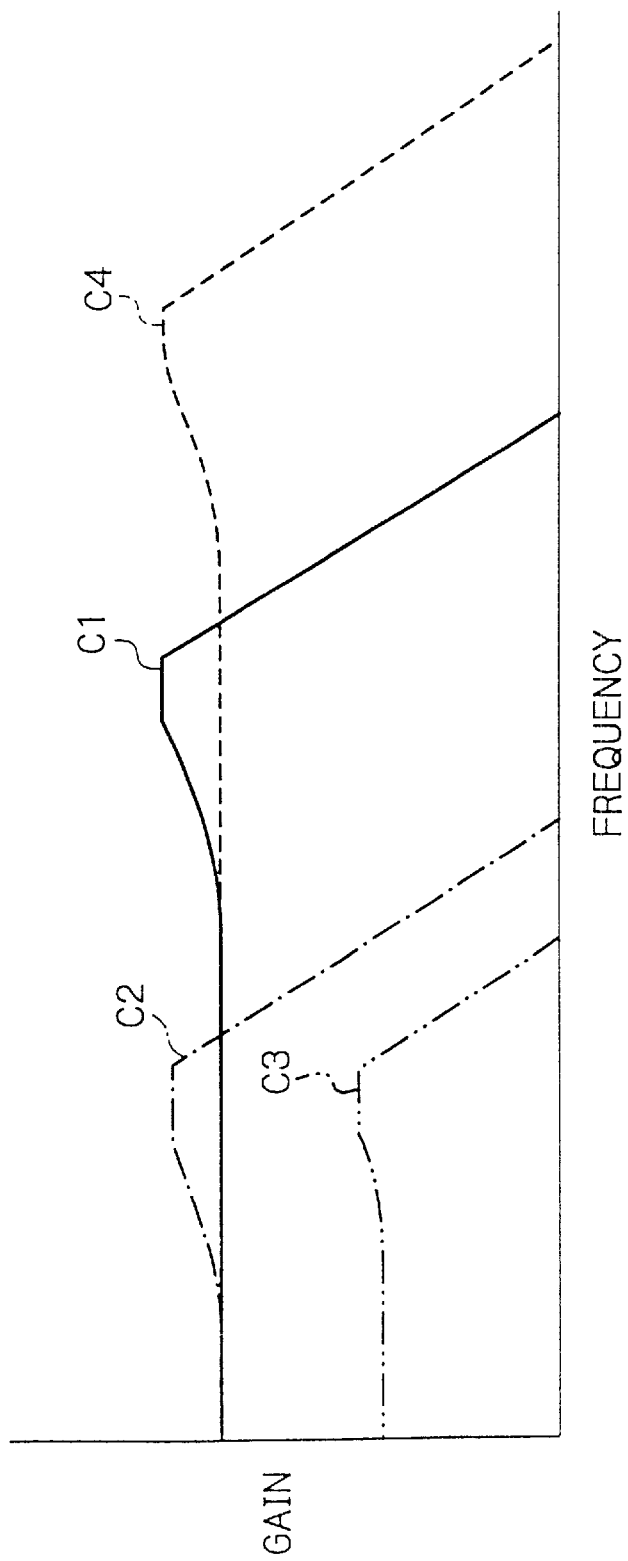

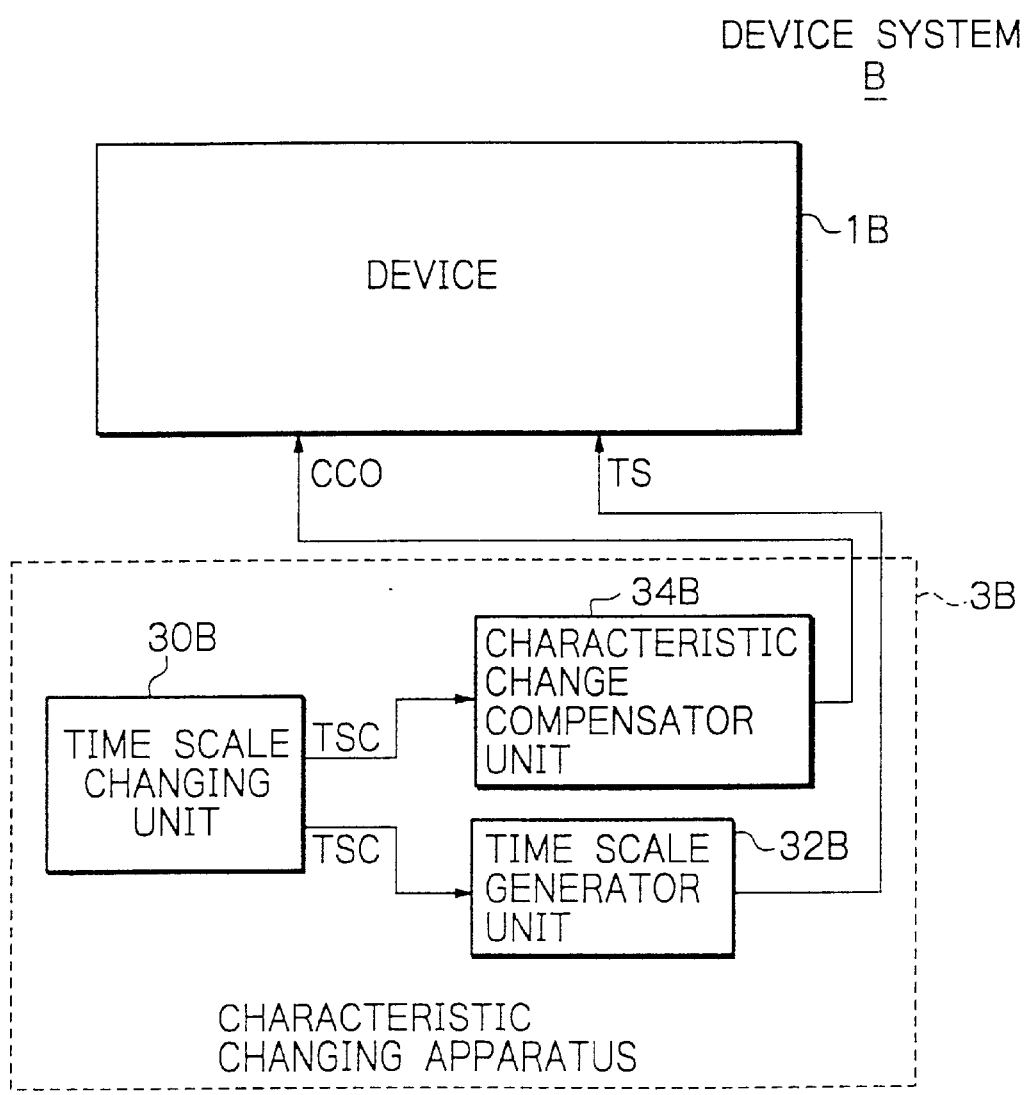

FEEDFORWARD SYSTEM

FEEDBACK SYSTEM

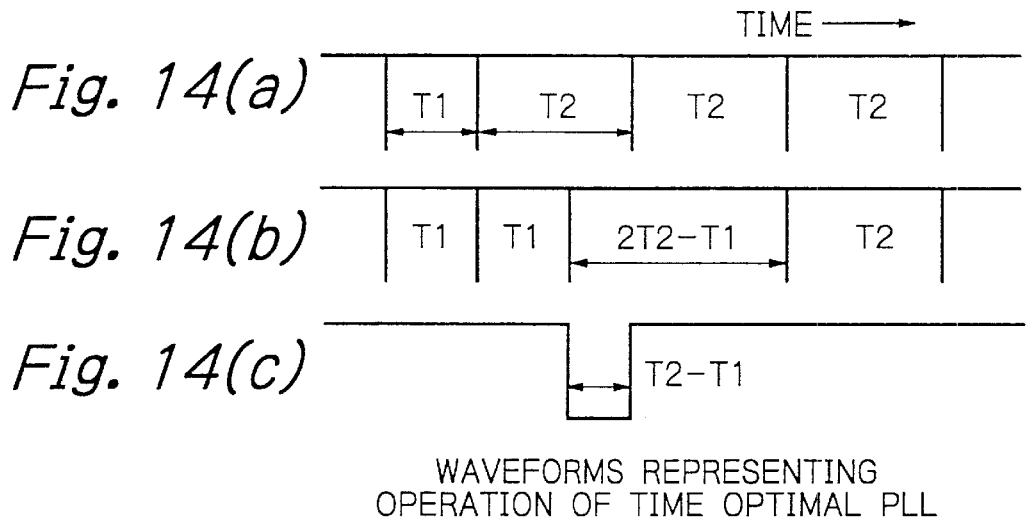
WAVEFORMS REPRESENTING
OPERATION OF TIME OPTIMAL PLL
Fig. 15
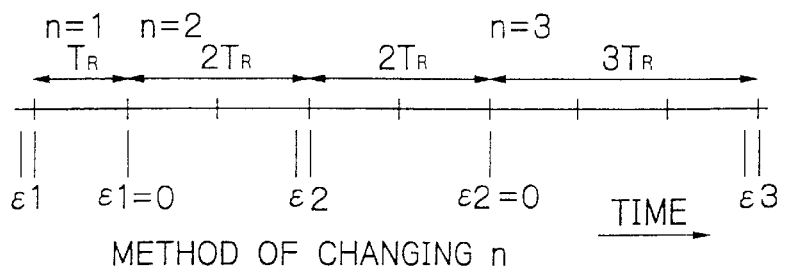
METHOD OF CHANGING n Fig. 17
| APPROACH | THD+N |
|---|---|
| n=1 (TIME OPTIMAL PLL) | 0.01% |
| UP TO n=127 | 0.006% |
| UP TO n=1,024 | 0.003% |
Fig. 18
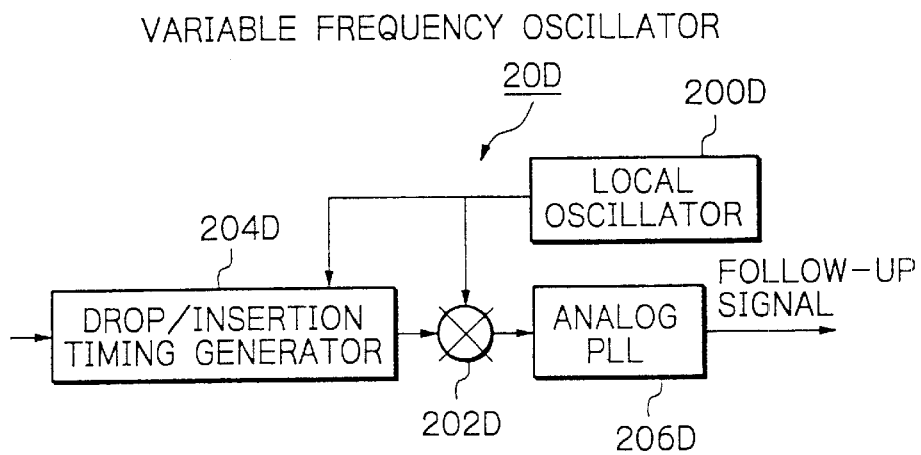
Fig. 19(a) OUTPUT OF LOCAL OSCILLATOR
Fig. 19(b) DROP/INSERTION TIMING
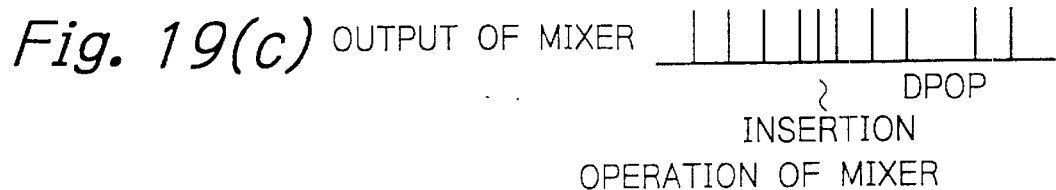
Fig. 19(c) OUTPUT OF MIXER
INSERTION OPERATION OF MIXER EXAMPLE OF CONFIGURATION OF MIXER
HAVING h STATES (STATE TRANSITION DIAGRAM)

DPOP/INSERTION TIMING GENERATOR
(MODULO INTEGRATOR)

PERIOD ESTIMATOR (INTEGRATION-TYPE U/D COUNTER)

PHASE DIFFERENCE ADJUSTER (LOADABLE U/D COUNTER)

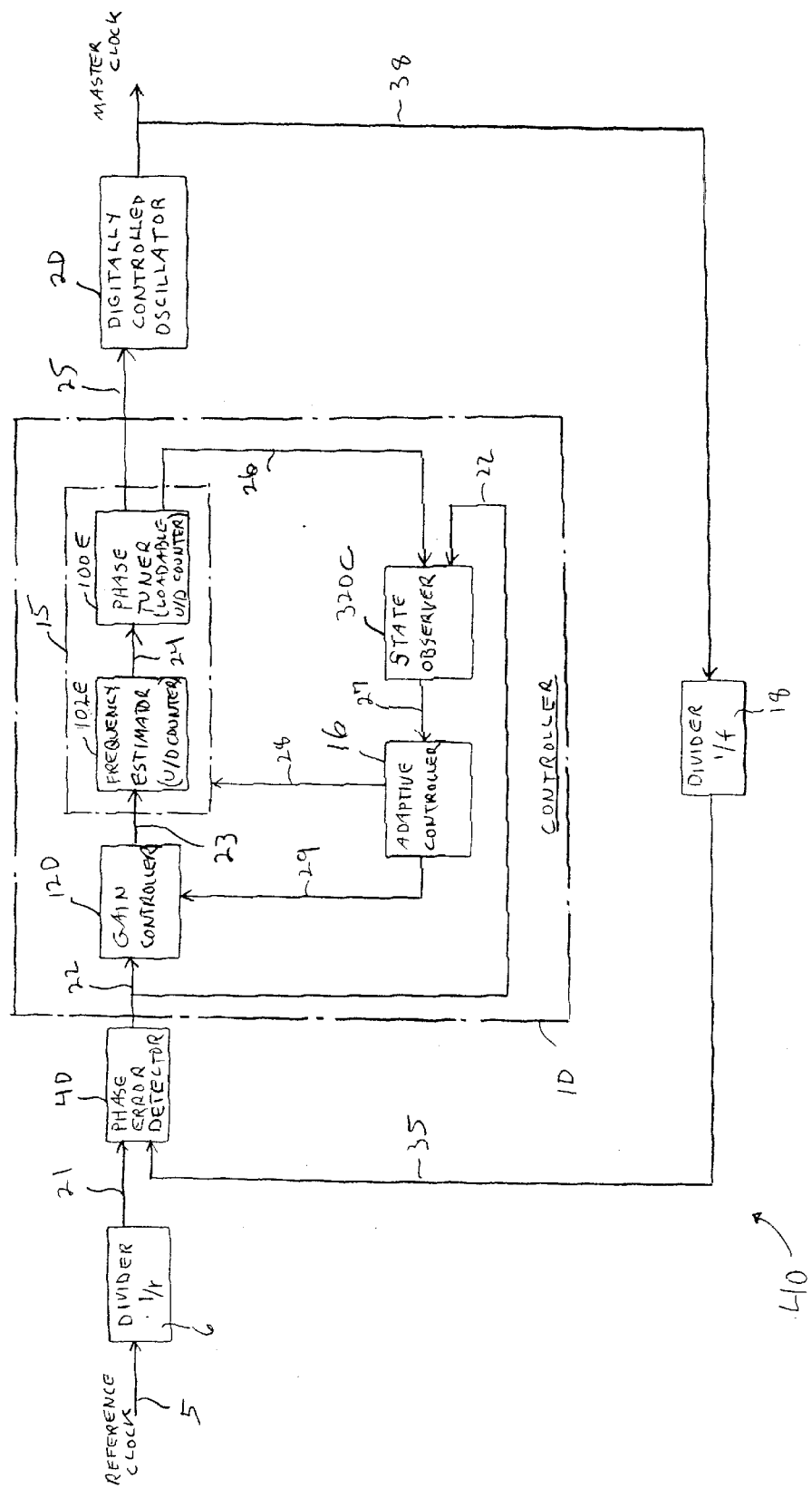

CONTROLLER FOR A DEVICE WITH CHANGE IN CHARACTERISTICS

BACKGROUND OF THE INVENTION

The present invention relates to a method and apparatus for changing the characteristics of a variety of devices of different scales, fields, types and so on such as plants, apparatus, microcomponents, circuits, circuit elements and so on.

Conventionally, a method of changing the characteristics of a device such as an electric circuit, an electronic circuit or the like, typically involves changing circuit constants or parameters such as resistance R, capacitance C and inductance L, changing the locations of circuit elements such as R, C, L within a circuit, or changing the entire configuration of the circuit. Such changes added to the device causes a change in the transfer function of the associated circuit, and consequently a change in an input/output response of the entire device such as time response and frequency response, and other arbitrary characteristics. Such a method provides an electric/electronic circuit having a response suitable for a particular target such as different control targets or a constant-desired-value control.

It should be noted herein that in this disclosure, the term "device" encompasses any devices which include a variety of apparatus of different scales such as plants, equipment, microcomponents, circuits, circuit elements and so on; apparatus for use in different fields such as electric, chemical, mechanical, physical fields, and apparatus of different types. Also, the "device" includes a "plant" or a "controlled object" which is so called in the field of control engineering.

In respect to a change in certain characteristic of a device, the time response characteristic of a control system will be described below by way of example with reference to FIGS. 31(a) to 31(d). The graphs in FIGS. 31(a) to 31(d) are described mathematically, and are not limited to any particular target. Possible controlled objects may span in a wide range of fields including, but not limited to, a positional (angular) control for a robot arm; a voltage control for a power supply regulator; a speed control for a bullet train; and so on. For example, disturbance is called "jitter" in an application to frequency tracking, while disturbance is called "ripple" in a power supply regulator. In this way, different expressions may be used for the same concept of control in different fields.

FIG. 31(a) shows that an excessively high sensitivity for a better initial response results in oscillations and high susceptibility to disturbance if a certain desired value is given for control. On the other hand, FIG. 31(b) shows that a lower sensitivity for suppressing disturbance results in a slower initial response. In this way, the sensitivity and disturbance suppression characteristics are different control targets and contradictory to each other. Conventionally, as shown in FIG. 31(c), while an attempt is made to find a control point which satisfies both of the characteristics by appropriately adjusting them, this generally results in employment of an unsatisfactory control point which is a compromise for both of the characteristics. More specifically, a control system which exhibits a relatively slow initial response and a relatively high susceptibility to disturbance is typically employed. A conventional adaptive control is intended to achieve the characteristics closest possible to those as illustrated in FIG. 31(d) by adaptively changing the sensitivity in accordance with a particular condition of a controlled object to simultaneously satisfy contradictory characteristics or control targets (the sensitivity and disturbance suppression characteristics in this example) to the utmost.

Referring now to FIGS. 32(a) and 32(b), the time responses illustrated in FIGS. 31(a)–31(d) will be described from a viewpoint of the frequency response. Whether the sensitivity (or response) is high or low can be found by examining how long a high range characteristic of a transfer function extends. More specifically, as illustrated in FIG. 32(a), a transfer function (representing the frequency characteristic of a system) exhibiting a high gain to a high frequency range may be created for increasing the sensitivity in order to improve the initial response. Conversely, as illustrated in FIG. 32(b), a transfer function exhibiting a lower gain in a high frequency range may be created for decreasing the sensitivity in order to suppress disturbance. As can be understood from the foregoing, a lower sensitivity in the high frequency range is equivalent to a reduction in gain in the high frequency range. Conventionally, many approaches falling within the foregoing category have been proposed to adjust the high frequency range characteristic without damaging the low frequency characteristic.

A specific example of a device required to address contradictory characteristics may be a phase locked loop (PLL) circuit. The PLL typically comprises a controller for controlling a voltage controlled oscillator (VCO), so that circuit constants, circuit configuration and so on of the controller are manipulated to design the PLL to have desirable follow-up speed, stability and so on of oscillating frequencies. Among a wide variety of PLLs, a "time optimal PLL" is known as an example which pursues the response speed rather than jitter suppression. The time optimal PLL has been published, for example, in an article entitled "Time optimal PLL Using High Speed Null Method" by Kobayashi et al, Transactions of Sensing Instrument Control Engineering Systems Information Computer Ergonomics (SICE), 16-4, pp573–578, 1980.

While the foregoing description has been directed particularly to a typical problem in the prior art on a control system including a PLL, similar problems are encountered also in devices such as apparatus of any fields, scales, types and so on which require adjustments of contradictory characteristics, not limited in electric/electronic circuits. For example, similar problems may be encountered in large-scaled plants, electronic apparatus such as computers, electronic devices such as microcomponents, sensors or the like, semiconductor circuits, and so on.

Also, other examples of contradictory characteristics, which require appropriate adjustments, may be resolution and drawing speed, resolution and conversion speed of an A/D converter, and a variety of other paired characteristics, in addition to the aforementioned response speed and disturbance suppression characteristics.

Since the above-mentioned prior art changes the characteristic of a device only using existing design parameters such as circuit constants, circuit configuration, and so on of the "device," complicated design procedures are often required for further improving the characteristics of the overall device. In addition, the realization of contradictory characteristics inevitably involves a considerable compromise, so that it is quite difficult to actually realize contradictory characteristics simultaneously.

SUMMARY OF THE INVENTION

It is therefore an object of the present invention to provide a method and apparatus for changing the characteristics of devices such as a variety of plants, equipment, circuits, semiconductor devices, and so on in a variety of fields, a variety of scales, a variety of applications, a variety of types, and so on, in a manner different from the prior art.

It is another object of the present invention to provide a method and apparatus for controlling a controlled object in a manner different from the prior art.

It is a further object of the present invention to provide a control method and apparatus which are capable of simultaneously realizing contradictory characteristics such as operation, performance and so on in the prior art.

It is a further object of the present invention to provide a method and apparatus which are capable of improving the characteristics of a device such as the operation and performance more than the prior art.

To achieve the above objects, the present invention employs the concept of time scale in changing the characteristics of a device.

Specifically, a device characteristic changing method according to the present invention changes a characteristic of the device by changing a time scale on which the device operates.

Also, a device characteristic changing apparatus for changing a characteristic of a device according to the present invention comprises time scale generating means for generating a time scale on which a device operates, and time scale changing means for changing the time scale, wherein a characteristic of the device is changed by changing the time scale on which the device operates.

According to the present invention, the device may have a first characteristic when it operates on a first time scale, and have a second characteristic when it operate on a second time scale different from the first time scale.

Also, according to the present invention, the characteristic may be a time dependent characteristic. In this case, the time dependent characteristic may be an input/output response characteristic of the device.

Also, in this case, the input/output response may be an input/output response which depends on the frequency of the device.

Further, according to the present invention, the characteristic may be changed to achieve different control targets, or to achieve a predetermined desired value. Also, the characteristic may be changed while maintaining a transfer function of the device substantially constant, or the changing of the characteristic is accompanied by changing of a transfer function of said device. Furthermore, the changing of the characteristic is accompanied or is not accompanied by changing of an element which affects a characteristic of the device other than the time scale.

Also, according to the present invention, the device may be a device which operates on different time scales to have substantially different characteristics from each other, and is operable on a variable time scale. The device may also include a device in an electric, mechanic, chemical or physical field. Further, the device may include a plant, equipment, a microcomponent, a circuit, or a circuit element. The device may operate in a digital form or in an analog form. The device may be a controller for use in a control system for controlling a controlled object. In this case, the control device may perform a feedforward control or perform a feedback control.

Further, according to the present invention, the time scale of the device may be determined in response to a signal external to the device or in response to a signal internal to the device. The transfer function of the device may be maintained substantially constant irrespective of a change in the time scale. The time scale may include real time as a time scale. A change in the time scale may include a change to an arbitrary number of time scales. The time scale may be changed in accordance with a predetermined sequence of time scales. In this case, the predetermined sequence may be determined for an adaptive control for achieving different control targets.

According to the present invention, a method of operating a device is also provided, wherein the method includes the device characteristic changing method.

Furthermore, according to the present invention, a device system including the aforementioned device characteristic changing apparatus, and a device is also provided.

Also, according to the present invention, a method of controlling a controlled object in response to an input signal includes the steps of generating a manipulated variable for the controlled object in response to the input signal in accordance with a predetermined transfer function including a time constant, generating a state value representative of a state of the controlled object, generating a time scale changing value from the state value using a predetermined time scale changing function, and changing the time constant of the transfer function in response to the time scale changing value.

According to the present invention, the control method may further include the step of providing the transfer function by transfer element means included in a controller which is used in a control system for controlling the controlled object. The control method may further include the step of generating a time scale on which the transfer element means operates. Also, the step of generating a state value may include generating the state value of the controlled object by observing a state within the control system.

Also, according to the present invention, a controller for use in a control system for controlling a controlled object in response to an input signal, comprises time scale generating means for generating a predetermined time scale, transfer element means having a predetermined transfer function for operating on the predetermined time scale, observing means for observing a state within the control system to generate a state value indicative of a state of the controlled object, time scale changing means having a predetermined time scale changing function, and for generating a time scale changing value derived from the predetermined time scale changing function with the state value from the observing means used as an input, and time scale changing means for changing the predetermined time scale in response to the time scale changing value.

Also, according to the present invention, in the control method and the controller, a change in the transfer function resulting from a change in the time constant may be compensated.

The generation of a time scale changing value may be performed by generating a first evaluation value from the state value using a first evaluation function, generating a second evaluation value from the state value using a second evaluation function, setting a predetermined first threshold value, setting a predetermined second threshold value, comparing the first evaluation value with the first threshold value to set the time scale changing value to an initial value when the first evaluation value is higher than the first threshold value, and comparing the second evaluation value with the second threshold value to update the time scale changing value when the second evaluation value is lower than the second threshold value.

Also, according to the present invention, the first and second threshold values may be equal, and the first and second evaluation functions may be equal. The initial value may be one, and the time scale changing value may be updated increasingly. Alternatively, the initial value may be a predetermined value, and the time scale changing value is updated increasingly or decreasingly.

The time scale changing value is updated by increasing the value in a predetermined sequence. The predetermined sequence may be an additive or multiplicative sequence.

Further, according to the present invention, a change in the time constant may include scaling up or scaling down the time scale in response to the time scale changing value. The scaling-up/scaling-down of the time scale may include using a reference signal generating means for generating a reference signal at a variable frequency. The reference signal generating means may generate the reference signal at a variable frequency by dropping an oscillating pulse and inserting the oscillating pulse.

Also, according to the present invention, the input signal may be a signal indicative of a desired value inputted to the control system, a signal indicative of a difference between a desired value inputted to the control system and a feedback value in the control system.

Also, according to the present invention, the transfer element means may include at least one of a derivative element, an integral element, a first-order lag element, a second-order lag element, and a dead time element.

Also, according to the present invention, the controller may comprise a discrete value system. Alternatively, the controller may comprise a continuous value system. In this case, the controller may include sampling means for sampling the input signal to generate a sampled input signal.

Further, according to the present invention, the control system may be a PLL circuit, or a time optimal PLL circuit.

Also, according to the present invention, a method of operating a controlled object is provided, wherein the method includes the aforementioned control method.

Further, according to the present invention, a control system including the aforementioned controller, and a controlled object is also provided.

The above and other objects, features, advantages of the present invention will become more apparent from the following description of the preferred embodiments, when taken in conjunction of the accompanying drawings.

BRIEF DESCRIPTION OF THE DRAWINGS

FIG. 1 is a block diagram illustrating a device system A according to a first embodiment to which the present invention is incorporated;

FIG. 2 is a graph including curves C1–C4 for showing how the frequency response of the device 1 of FIG. 1 varies in response to a change in a time scale;

FIG. 3 is a block diagram illustrating a device system B according to a second embodiment of the present invention;

FIGS. 4(a) and 4(b) are graphs illustrating frequency responses derived from the device system B of FIG. 3, wherein FIG. 4(a) illustrates the frequency characteristic of a transfer function, identical to the characteristic illustrated in FIG. 32(a), which exhibits substantially a constant gain extending to a high frequency range in order to provide a faster initial input/output response, and FIG. 4(b) illustrates the frequency characteristic of a transfer function which is changed, utilizing a time scale change for the device B in accordance to the present invention, to reduce the gain in a high frequency range for suppressing disturbance;

FIGS. 14(a) to 14(c) are timing diagrams for explaining the operation principles of a conventional known time optimal PLL;

FIG. 15 is a diagram illustrating how the time scale or the sampling period is changed using the relationship among the deviation $\epsilon$, the time scale coefficient n, and the sampling period;

FIG. 17 is a table showing the effect of the PLL circuit D according to the present invention in comparison with a conventional time optimal PLL;

FIG. 18 is a block diagram illustrating a variable frequency oscillator 20D which is an embodiment of a variable frequency oscillator 2D in FIG. 12;

FIGS. 19(a) to 19(c) are timing diagrams for explaining the operation of the variable frequency oscillator 20D of FIG. 18;

FIG. 33 is a detailed block diagram of a sampling period adaptive control tracking system according to the present invention.

DETAILED DESCRIPTION OF THE INVENTION

Figure 4A:
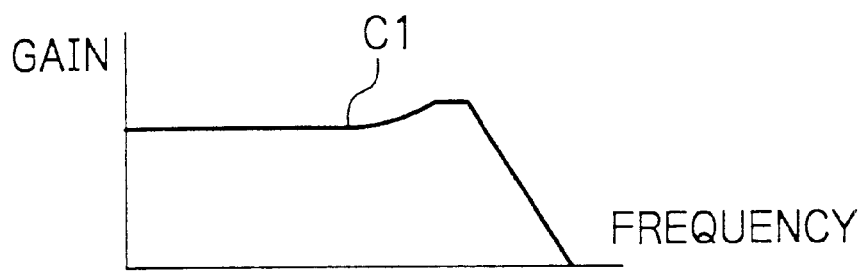

The present invention will hereinafter be described for several embodiments thereof in detail with reference to the accompanying drawings.

First Embodiment

FIG. 1 illustrates in block diagram a device system A according to a first embodiment which incorporates the present invention. The device system A comprises a device 1, the characteristics of which are to be changed, and a characteristic changing apparatus 3 for changing the characteristics of the device 1. As mentioned above, the device 1 is assumed to encompass apparatus of different scales such as plants, equipment, microcomponents, electric circuits and electric circuit elements, and so on; apparatus of different fields such as electricity, chemistry, mechanics, physics and so on; or apparatus of different kinds. The characteristic changing apparatus 3 provides a time scale on which the device 1 operates, and comprises a time scale changing unit 30 and a time scale generator unit 32, as illustrated. Here, the term "time scale" means the scale of a time axis, and is intended to be a concept including real time (absolute time). The time scale changing unit 30 generates at its output a time scale changing signal TSC for changing the time scale on which the device 1 operates in response to an input external to the system or in response to a signal internal to the system. The time scale generator unit 32, responsive to the output TSC, generates at its output a time scale output TS specified by the received time scale changing signal TSC. The time scale generator unit 32 may comprise, for example, a variable frequency oscillator, variable frequency clock generator, or the like. Examples of the time scale output TS may be a variable frequency oscillating output, a clock signal, and so on.

FIG. 2 illustrates how an input/output response, which is one of the characteristics of the device 1, particularly, the frequency response varies as the time scale is changed. Assuming herein that the device 1 has a certain transfer function, and a curve C1 represents a frequency response of the device 1 at a time scale value TS1, which is relied on by the device 1 as a certain basis, the frequency response is represented by a curve C2 when the time scale is moved from the value TS1 to a higher time scale value TS2. This is because the frequency characteristic is shifted to the lower frequency side due to a compression of the time scale. When the time scale is changed to a value lower than TS1, the resulting expansion of the time scale causes the reverse phenomenon, i.e., the characteristic is changed from the curve C1 to a curve C4. In this way, a change in the time scale on which the device 1 operates can change the frequency response both in the frequency direction and in the gain direction. In the first embodiment, any change is not made to circuit constants, circuit configuration or the like of the device 1. When circuit constants or the like are also changed together with the change in the time scale, the characteristic can also be scaled down or scaled up in the frequency direction without significantly changing the shape of the characteristic (this scale-down or scale-up of the characteristics is different from a simple translation), as a curve C3. It should be noted that while the embodiment of FIG. 1 shows the time scale generator unit 32 disposed external to the device 1, the time scale generator 32 may be omitted if the device 1 itself comprises such a generator unit therein.

Second Embodiment

Next, a device system B according to a second embodiment of the present invention will be described with reference to FIG. 3. FIG. 3 illustrates in block diagram the device system B which differs from the device system A of FIG. 1 only in that a characteristic change compensator unit 34B is added to the device characteristic changing apparatus 3A, so that the following description will particularly focus on the characteristic change compensator unit 34B. The elements in FIG. 3 identical to those in FIG. 1 are designated the same reference numeral followed by a character "B." As illustrated, the characteristic change compensator unit 34B comprises an input for receiving a time scale changing signal TSC from a time scale changing unit 30B, and an output for generating a characteristic change compensation output CCO to a device 1B. The characteristic change compensator unit 34B compensates the device 1B for a change in the characteristics in response to the time scale changing signal TSC. Here, the term "compensation" means that the characteristics of the device is compensated to maintain the transfer function of the device 1B or transform the same into an arbitrary predetermined alternative. It is contemplated, for example, that the characteristic change compensator unit 34B changes the transfer function of the device 1B so as to cancel a change in the transfer function of the device 1B resulting from a change in the time scale, or adds a transfer element having a transfer function for canceling the change. As a method for changing the transfer function, a variety of arbitrary known techniques may be utilized. Also, while the compensator unit 34B is shown as disposed external to the device 1B, the compensator unit 34B may be incorporated in the device 1B itself.

Figure 4B:
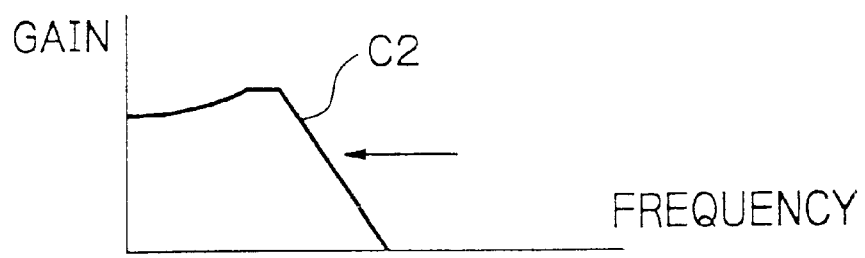
Figure 32A:
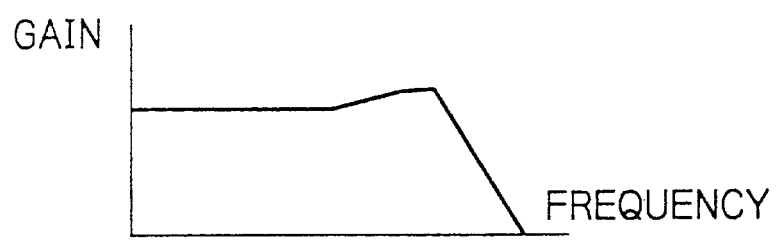
FIGS. 32(a) and 32(b) are graphs illustrating the frequency characteristics from a viewpoint of the frequency response for the time responses illustrated in FIGS. 31(a) to 31(d).
Figure 32B:
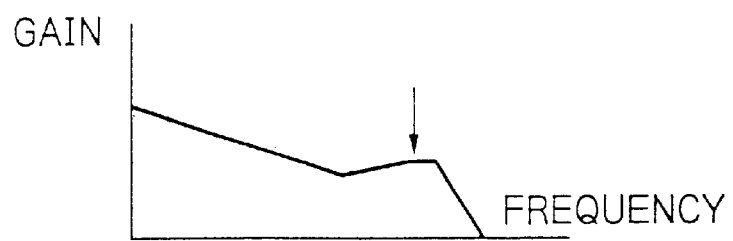

The frequency response produced by the device system B of the present invention illustrated in FIG. 3 will be described with reference to FIGS. 4(a), 4(b). FIG. 4(a) illustrates the same characteristic as that illustrated in FIG. 32(a), i.e., the frequency characteristic of a transfer function which exhibits substantially a constant gain extending to a high frequency range in order to provide a faster initial input/output response. FIG. 4(b), on the other hand, illustrates the frequency characteristic of a transfer function which is changed, utilizing a time scale change for the device B in accordance to the present invention, to reduce the gain in a high frequency range for suppressing disturbance. As can be understood from the graphs, the additional compensation of the transfer function, together with a scaled-down time scale enables the curve C1 to move to the position of the curve C3 rather than the curve C2 (see FIG. 2) without significantly changing the shape of the characteristic. This results in a frequency characteristic which suppresses the gain in a high frequency range, similar to the characteristic of FIG. 32(b).

As will be appreciated from the foregoing, the present invention can readily provide a device with different frequency characteristics, which have not been readily realized in the prior art, only by changing the time scale or by changing the time scale and compensating the device for the change in the characteristic.

Third Embodiment

Next, a third embodiment of the present invention will be described with reference to FIG. 5 for a control system to which the present invention is applied. As illustrated, the control system C comprises a controller 1C (corresponding to the device 1B in FIG. 3) for controlling an arbitrary controlled object 2C, and a characteristic changing apparatus 3C (corresponding to the device characteristic changing apparatus 3B in FIG. 3) for changing the characteristics of the controller 1C. The control system C has a configuration substantially similar to that of the device system B in FIG. 3, except that the device 1B is a controller for a control system. The controller 1C has a predefined transfer function which is determined by a conventional design approach using circuit constants, circuit configuration, or the like, for controlling the controlled object 2C. Any controller having arbitrary characteristics, particularly, those previously proposed as having good characteristics, may be used as the controller C1. An example of the controller 1C is the aforementioned time optimal PLL which exhibits supremacy in fast response. The controller 1C receives at its input an input signal IN indicative of a desired value for control or a deviation of the desired value to a feedback signal, and generates an output signal OUT which indicates a manipulated variable for the controlled object 2C in response to the input signal IN.

Figure 5:
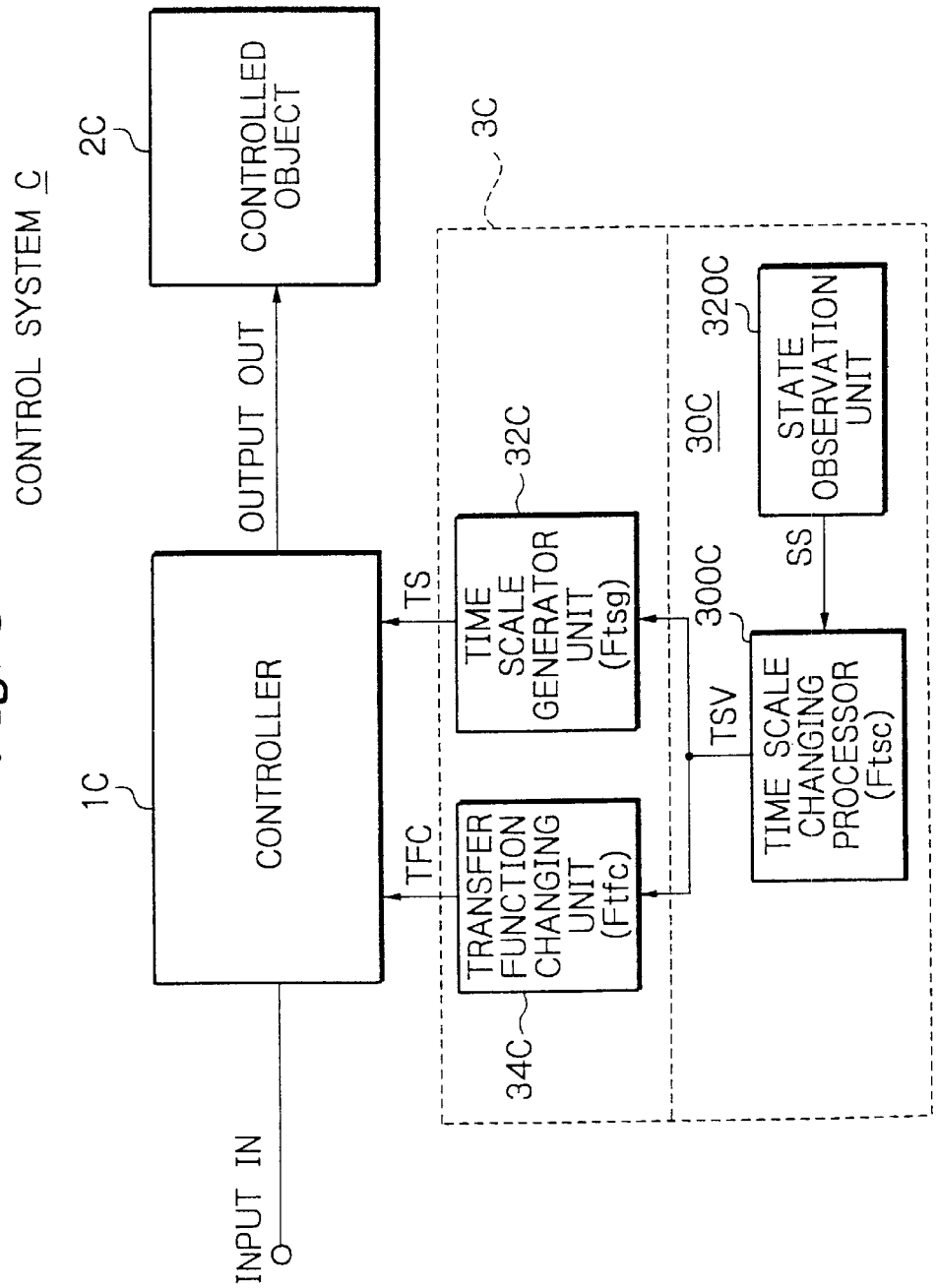
FIG. 5 is a block diagram illustrating a control system C according to a third embodiment, wherein the present invention is applied to a control system.

The configuration of FIG. 5 also differs from that of FIG. 3 in that the time scale changing unit 30C comprises a state observation unit 320C in addition to a time scale changing processor 300C, and the characteristic change compensator unit 34B is replaced with a transfer function changing unit 34C. More specifically, the time scale changing unit 30C includes the time scale changing processor 300C, and the state observation unit 320C for knowing the state of the controlled object 2C directly from the controlled object 2C or indirectly from a portion other than the controlled object 2C within the control system C (for example, the input or the output of the controller, or any appropriate position within the controller). For knowing the state of the controlled object 2C indirectly, the state observation unit 320C may also be referred to as a "state estimator." The state observation unit 320C generates at its output a state signal SS indicative of the state of the controlled object observed thereby. The time scale changing processor 300C, which receives the state signal SS, has a predetermined time scale changing function Ftsc. This function is involved in generating a time scale value TSV from the state signal SS from the state observation unit 320C for specifying a time scale value, which should be used when the current state signal SS presents a particular value. The function Ftsc may be implemented by a variety of known methods including a lookup table. Next, a time scale generator unit 32C, which receives the time scale value TSV, is similar to the time scale generator unit 32B in FIG. 3. The time scale generator unit 32C has a predetermined time scale generating function Ftsg for generating the time scale. Specifically, the time scale generator unit 32C determines a time scale generated by the function Ftsg with the time scale value TSV as an input, and generates a time scale output TS having the thus determined time scale. The simplest example of the function Ftsg is a constant of one ("1"). In this embodiment, the time scale output TS is a variable frequency clock signal. Here, the scale-up of the time scale refers to a reduction in the frequency of the clock signal, while the scale-down of the time scale refers to an increase in the frequency. The time scale output TS may be implemented not only by a rectangular signal such as a clock signal but also by any other arbitrary signal having a periodic waveform such as a sinusoidal oscillator output. It should be noted that a portion of the time scale generator unit 32C for generating a variable frequency clock may be omitted if the controller 1C contains such a clock generator.

The present invention has the ability of changing the time constant associated with the transfer function of a transfer element within the controller 1C by changing the time scale using the time scale generator unit 32C. Thus, the present invention provides an approach of adaptively varying the frequency characteristic of a control system by adaptively changing preferably the time scale. As one advantage of the present invention, previously proposed characteristic control systems may be used as they are (without changing characteristic circuit constants or the shape of their transfer functions).

The transfer function changing unit 34C, which receives the time scale value TSV, is a component corresponding to the characteristic change compensator unit 34B in FIG. 3, embodies the compensator unit 34B in a more specific manner. The transfer function changing unit 34C is intended to handle the transfer function of the controller 1C as a characteristic to be changed, and has a predetermined transfer function changing function Ftfc for changing the transfer function. The transfer function changing unit 34C generates a transfer function changing output TFC for changing the transfer function of the controller 1C in accordance with the function Ftfc with the time scale value TSV used as an input. The TFC output is adapted to the configuration of a circuit (not shown) used to change the transfer function disposed within the controller 1C.

Figure 6:
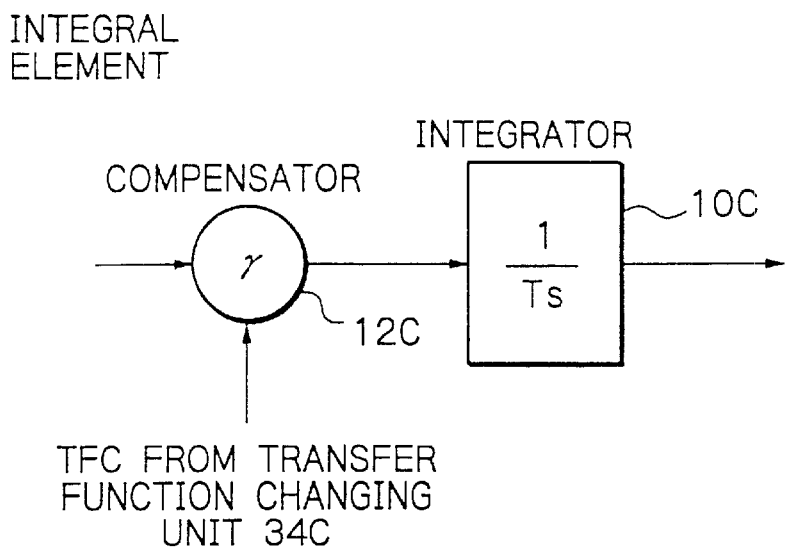
FIG. 6 is a block diagram for explaining a transfer function changing unit 34C in FIG. 5 in greater detail, in which a controller 1C comprises an integral element.

The transfer function changing unit 34C will be described in greater detail with reference to FIGS. 6 and 7. FIG. 6 illustrates an example in which the controller 1C is supposed to consist only of an integrator 10C which is an integral element. The transfer function G1 of the integrator 10C is represented by 1/Ts as shown, where T is a time constant, and s is the Laplace operator. In this example, the controller 1C is provided with a compensator 12C for compensating the transfer function G1 for a change resulting from variations in the time constant caused by changing the time scale. The compensator 12C comprises a multiplier for compensating the transfer function G1 of the integrator 10C so that it remains constant. The multiplier 12C is a circuit for multiplying the input to the controller 1C by a coefficient γ. Specifically, the multiplier 12C multiplies its input by the coefficient γ having a value indicated by the transfer function changing output TFC from the transfer function changing unit 34C, and outputs the resultant product. The transfer function G1 in the illustrated configuration is expressed by the following equation (1).

$$G1 = \frac{1}{(T/\gamma)s} \quad (1)$$

As will be understood from equation (1), for maintaining the transfer function G1 constant irrespective of a change in the time constant T, the coefficient γ may be doubled if the time constant is increased by a factor of two. In this way, the transfer function G1 can be maintained constant. When the coefficient γ is maintained at one (γ=1), the transfer function G1 is one half of the transfer function before the time constant T is changed. If such a transfer function is desired, the compensator as in this example may be omitted, or the transfer function changing unit 34C may be configured to change the transfer function G1 to another transfer function.

Figure 7A:
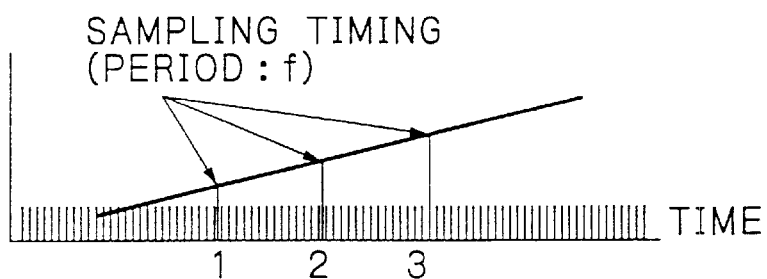
FIGS. 7(a) and 7(b) are diagrams for explaining the operation of the transfer function changing unit configured as illustrated in FIG. 6.
Figure 7B:
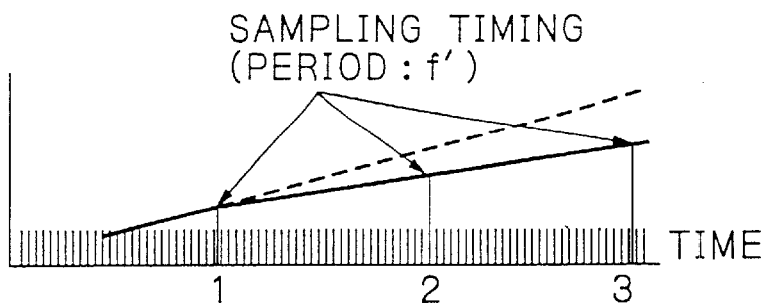

The operation of the transfer function changing unit 34C, when the configuration of FIG. 6 is employed, will be described with reference to FIGS. 7(a), 7(b) which illustrate output waveforms generated when a constant input signal is applied to the compensator. FIG. 7(a) shows the output waveform when a sampling period is f; and FIG. 7(b) when the sampling period is f'. In the graphs, the horizontal axis represents the time, and small scale marks indicate operating clocks. In FIG. 7(a), the output waveform is sampled at sampling timings 1, 2, 3. For restoring the same input/output response of the integrator at the sampling timing at which the sampling period is changed from f to f' when the sampling period is changed from f to f' at timing 1 in FIG. 7(a) by changing the time scale, the constant input signal may be reduced from a dotted line to a solid line in FIG. 7(b), corresponding to the extended sampling period. The adjustment to the constant input signal may be made by the compensator 12C in the aforementioned example. Since a longer sampling period results in a lower sensitivity or response speed of the integrator, the integrator will have a higher disturbance suppression capability. Conversely, the characteristic reverse to the above can be realized by reducing the sampling period.

Figure 8:
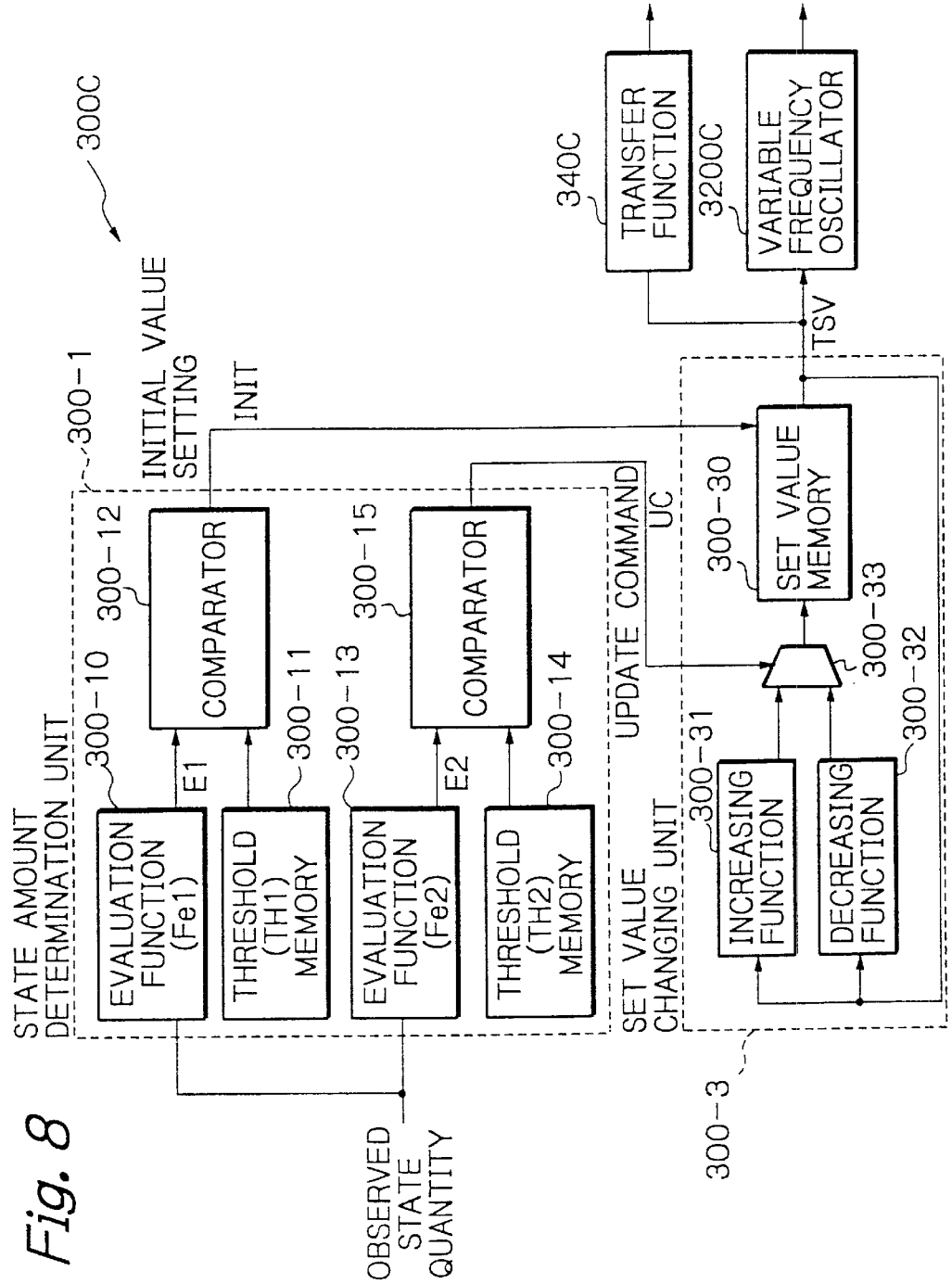
FIG. 8 is block diagram illustrating a specific circuit configuration of a time scale changing processor 300C in FIG. 5.

Next, a specific circuit for the time scale changing processor 300C will be described with reference to FIG. 8. As illustrated, the time scale changing processor 300C comprises a state quantity determining unit 300-1 which receives a state value of a controlled object from the state observation unit 320C in FIG. 5; and a set value updating u10t 300-3 connected to the state quantity determining unit 300-1. FIG. 8 also shows a variable frequency oscillator 3200C and a transfer function changing means 340C corresponding to the time scale generator unit 32C and the transfer function changing unit 34C in FIG. 5, respectively. More specifically, the state quantity determining unit 300-1 includes two sets of a circuit configuration comprised of a evaluation function circuit 300-10 or 300-13, a threshold value memory 300-11 or 300-14, and a comparator 300-12 or 300-15. The evaluation function circuit 300-10 receives an observed state quantity at its input, evaluates the state quantity in accordance with a built-in predetermined evaluation function Fe1, and generates an evaluation result E1 at its output. The threshold value (TH1) memory 300-11 stores a threshold value TH1 which serves as the basis for determining the evaluation result E1 through the evaluation function Fe1, and supplies this threshold value to its output. The comparator 300-12 receives the evaluation result E1 and the threshold value TH1, and generates an initial value setting output INIT set at HIGH when the evaluation result E1 is equal to or higher than the threshold value TH1. Conversely, the comparator 300-12 sets the initial value setting output INIT at LOW when the evaluation result E1 is lower than the threshold value TH1. In this way, the time scale changing processor 300C operates to set the time scale at an initial value when the evaluation result E1 exceeds the threshold value TH1. The evaluation function circuit 300-13 in the other set has a second evaluation function Fe2 which may be equal to or different from the evaluation function Fe1, and generates at its output a result E2 of the evaluation on a received state quantity in accordance with the second evaluation function Fe2. The threshold value (TH2) memory 300-14 stores and outputs a threshold value TH2 which may be equal to or less than the threshold value TH1. The comparator 300-15 receives the evaluation result E2 and the threshold value TH2, and sets an update command signal UC at LOW to stop updating the time scale change when the evaluation result E2 is equal to or higher than the threshold value TH2, and sets the update command signal UC at HIGH to update the time scale change in accordance with a predetermined sequence associated therewith when the evaluation result E2 is lower than the threshold value TH2.

A set value update unit 300-3 receives the initial value setting output INIT and the update command signal UC. The set value update unit 300-3 comprises a time scale setting value memory 300-30 having an input for receiving the initial value setting output INIT; an increasing function circuit 300-31 and a decreasing function circuit 300-32 each having an input connected to the output of the memory 300-30; and a selector 300-33 which receives the outputs of the function circuits 300-31, 300-32. The output of the selector 300-33 is connected to another input of the time scale setting value memory 300-30. More specifically, the memory 300-30 generates an initial value of the time scale stored therein as a time scale value TSV when the initial value setting output INIT is at HIGH, and generates an input received from the selector 300-33 at its output when the initial value setting output INIT is at LOW. The two function circuits 300-31, 300-32, which receive the output of the memory 300-30, are circuits for generating a value by which the output of the memory 300-30 is increased or decreased. The selector 300-33, which receives the increased or decreased value, does not select any of the outputs from the function circuits 300-31, 300-32 when the update command signal UC is at LOW, so that the memory 300-30 continues to output the initial value. On the other hand, as the update command signal UC transitions to HIGH, the selector 300-33 selects the output from the increasing function circuit 300-31 and delivers the same to the output when the initial value is a minimum value within a time scale update range. In this event, the output of the increasing function circuit 300-31 is delivered to the output of the memory 300-30 in place of the initial value. As long as the update command signal UC remains at HIGH, the output of the memory 300-30 is fed back to the increasing function circuit 300-31 to generate a further increased signal which is output from the memory 300-30 through the selector 300-33. In this way, the time scale value TSV can be gradually increased. The action implemented by the foregoing configuration will be described in conjunction with the simplest example in which the evaluation function Fe1 is set to one (Fe1=1); the evaluation function Fe2 is set to one (Fe2=1); TH1 is set equal to TH2 (TH1=TH2); and the initial value represents the most scaled-down time scale. First, the time scale changing processor 300C sets the time scale to the most scaled-down time scale (corresponding to a higher sampling frequency in the above-mentioned example) when an observed state quantity is higher than the threshold value TH1 to increase the sensitivity of the controller 1C, i.e., the response speed. Subsequently, when the state quantity is reduced below the threshold value TH2, the time scale changing processor 300C increases the time scale from the initial value to scale up the time scale for reducing the sensitivity of the controller 1C. As long as the state quantity is lower than the threshold value TH2, the time scale changing processor 300C continues to scale up the time scale to further reduce the sensitivity of the controller 1C, thereby making it possible to enhance the stability of the controller 1C. If the state quantity suddenly increases to exceed the threshold value TH1 while the sensitivity of the controller 1C is being reduced, the time scale changing processor 300C again scales down the time scale to increase the sensitivity of the controller 1C, thereby enabling a faster response.

While the increasing function is used in the foregoing example, the selector 300-33 is operable, when the initial value is a maximum value within the time scale changing range, to select the output of the decreasing function circuit 300-32 and delivers the same to its output, so that a decreased time scale is generated at the output of the memory 300-30 in place of the initial value. As long as the update command signal UC remains at HIGH, the output of the memory 300-30 is fed back to the decreasing function circuit 300-31 to generate a further reduced signal. It should be noted that in the foregoing two cases, one of the increasing function and the decreasing function may be omitted. In addition, when the time scale initial value lies in the middle of the time scale changing range, the increasing function and the decreasing function may be used in combination, in which case, at least one set of an evaluation function circuit, a threshold value memory and a comparator is added to select one of the increasing function and the decreasing function.

Figure 9A:
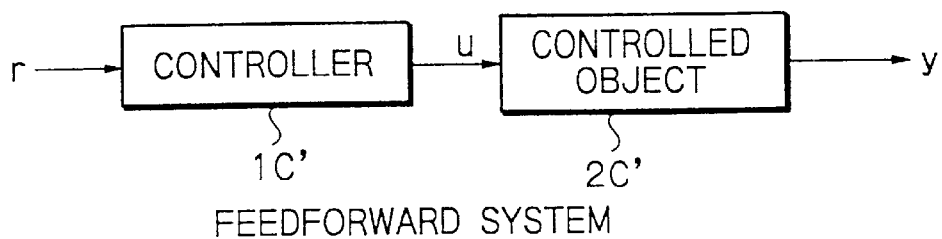
FIGS. 9(a) and 9(b) are block diagrams illustrating a feedforward system and a feedback system which are examples of modifications to the control system C of FIG. 5.
Figure 9B:
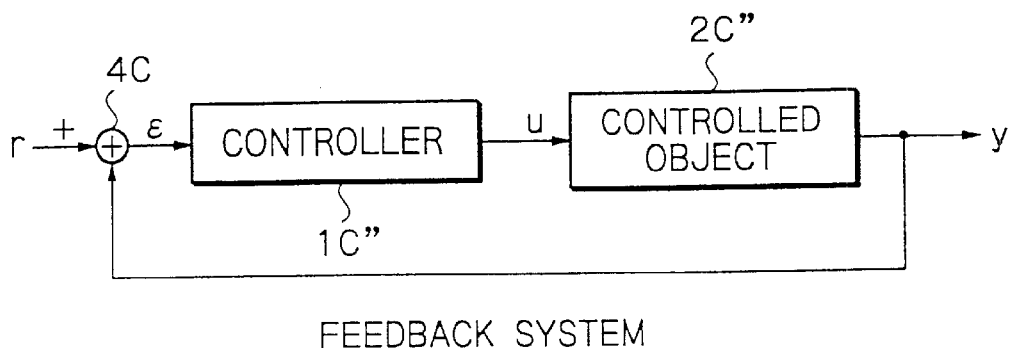

Next, an example of a modification to the control system C illustrated in FIG. 5 will be described with reference to FIGS. 9(a), 9(b). Although not particularly illustrated in FIG. 5, the control system C of FIG. 5 may be implemented in a feedforward system configuration as illustrated in FIG. 9(a). In this case, an input IN is equal to a desired value r as described above. Alternatively, the control system C may be implemented in a feedback system configuration as illustrated in FIG. 9(b), in which case, an input IN is equal to a deviation ε derived by calculating the difference between a desired value r and a feedback signal γ by an adder 4C.

Figure 10:
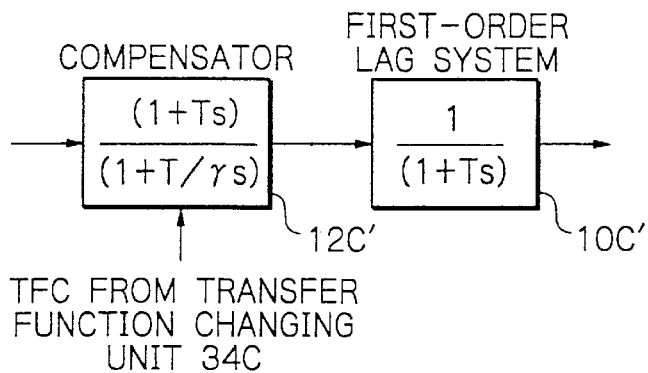
FIG. 10 is a block diagram illustrating an example of a modification to a controller 1C and a transfer function changing unit 34C, where a transfer element 10C' of the controller 1C comprises a first-order lag element.

Next, an example of a modification to the controller 1C and the transfer function changing unit 34C will be described with reference to FIGS. 10 and 11. FIG. 10 shows that a transfer element 10C' of the controller 1C is composed of a first-order lag element. As shown, the transfer function of the first-order lag element is represented by 1/(1+Ts). Likewise, with the first-order lag element, the illustrated compensator 12C' may be used to perform a compensation to maintain the transfer function. More specifically, the compensator 12C' is connected between the input to the controller 1C and the input to the first-order lag element 10C', and is provided with a transfer function, the numerator of which has the same term as the term in the denominator of the transfer function of the first-order lag element 10C' in order to cancel the operation resulting from the denominator, and the denominator of which has a term as the term of the denominator of the transfer function of the first-order lag element which receives a change of the time constant. The compensator 12C' changes the value of the coefficient γ in response to the transfer function update output TFC from the transfer function changing unit 34C. The compensation provided by the compensator of the type mentioned above can be employed when a multiplier as illustrated in FIG. 6 cannot be added to an integrator within a first-order lag element. A compensation similar to the foregoing may also be employed in a derivative element, a second-order lag element, and so on. It should be noted however that a dead time element cannot be compensated for maintaining the transfer function constant.

Figure 11:
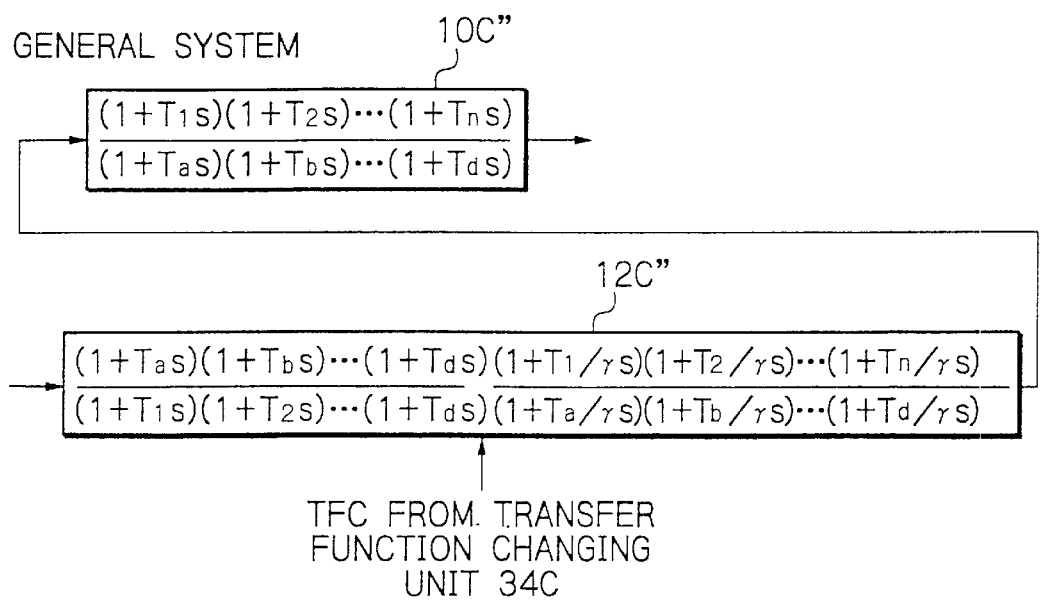
FIG. 11 is a block diagram illustrating an example of a compensator when a transfer element of the controller 1C is a general system.

FIG. 11 illustrates an example of a compensator for a general system. As illustrated, a transfer element 10C" in a general system has the transfer function represented by a general equation in the block. Thus, a used compensator 12C", which has the transfer function represented by the equation in the block, can maintain the transfer function of a transfer element irrespective of a change in the time scale, by using the transfer function in the block. A coefficient γ in the transfer function of the compensator 12C" is specified by the transfer function changing output TFC from the transfer function changing unit 34C in FIG. 5.

It should be noted herein that while the foregoing compensator performs a compensation for maintaining the transfer function constant, such a compensation intended for a constant transfer function may not be required if a change in the transfer function is acceptable or if such a change is desired. Therefore, if it is desired that a transfer function be changed in a desired manner in accordance with a change in the time scale, the compensator may be used to compensate the transfer function for a shift from the desired change.

Fourth Embodiment

Figure 12:
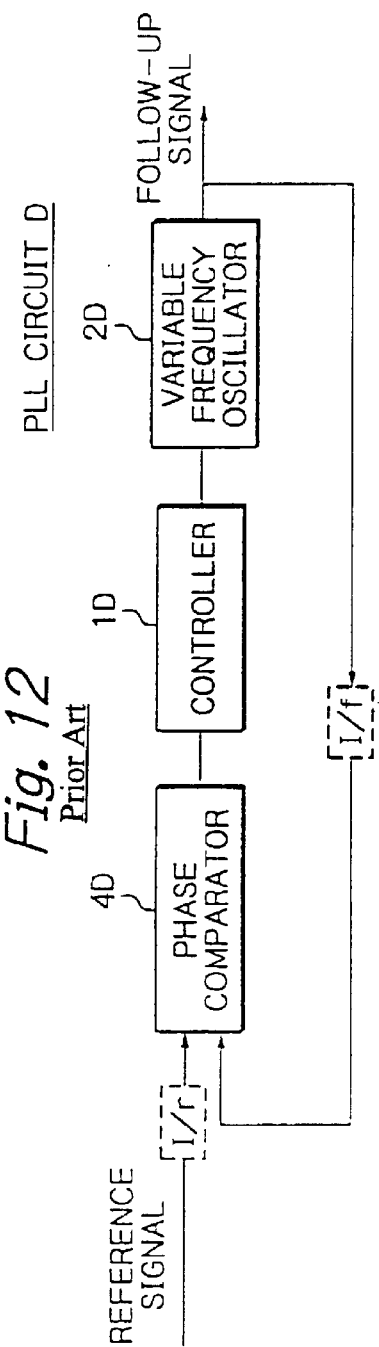
FIG. 12 is a block diagram illustrating a PLL circuit D according to a fourth embodiment in which the present invention is applied to a time optimal PLL.

Next, a fourth embodiment of the present invention will be described in connection with the time optimal PLL to which the present invention is applied, with reference to FIGS. 12 to 15. As illustrated in FIG. 12, a PLL circuit D according to the present invention comprises a phase comparator 4D which receives a reference signal r, with which the phase should be synchronized, at one of two inputs thereof; a controller 1D according to the present invention; and a variable frequency oscillator 2D such as a voltage controlled oscillator (VCO), as is the case with a conventional PLL circuit. The output of the oscillator 2D is connected to the other input of the phase comparator 4D. In addition, a 1/r frequency divider circuit may be interposed between the one input of the phase comparator 4D and the reference signal r, and a 1/f frequency divider circuit may be interposed between the other input of the phase comparator 4D and the output of the oscillator 2D, as required (indicated by dotted blocks in FIG. 12).

Figure 13:
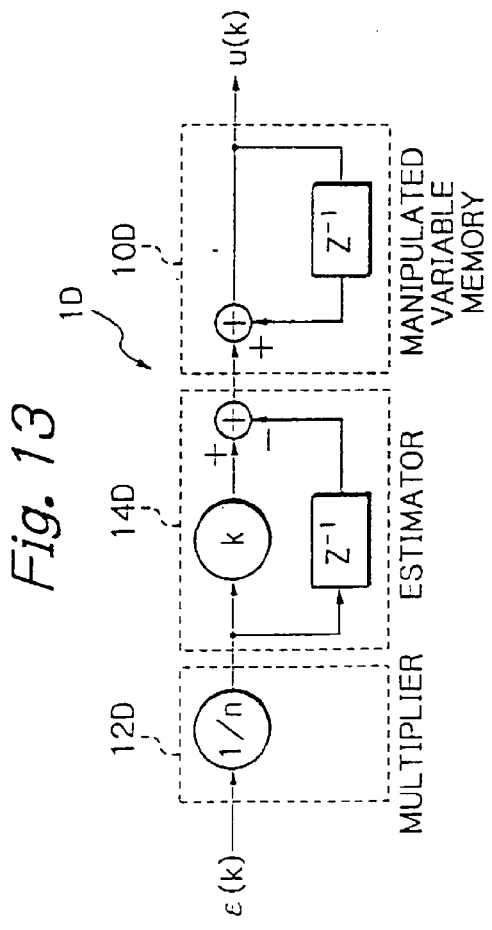
FIG. 13 is a block diagram illustrating details of a controller 1D in FIG. 12.

FIG. 13 is a block diagram illustrating details of the controller 1D of FIG. 12. The controller 1D comprises a 1/n multiplier 12D (γ=1/n: n designates a time scale coefficient) which receives a deviation signal ε(k) from the phase comparator 4D; an estimator 14D which characterizes the time optimal PLL; and a manipulated variable memory 10D. The estimator 14D comprises a $Z^{-1}$ element and a k-times multiplier which receive the output of the multiplier 12D; and an adder for subtracting the output of the $Z^{-1}$ element from the output of the k-times multiplier. The manipulated variable memory 10D comprises an adder; and a $Z^{-1}$ element which receives the output of the adder, where the adder is connected to add the output of the $Z^{-1}$ element to the output of the estimator 14D. The $Z^{-1}$ element is a register for holding data for one sampling time. The sampling time is associated with a periodic signal generated each time a data measurement made by the phase comparator 4D is ended, and is substantially equal to the frequency of the reference signal (or its 1/r). The transfer function of the overall controller is represented by the following equation (2):

$$X(Z)=(k-Z^{-1})/(1-Z^{-1})/n \qquad (2)$$

Here, equation (2) matches the transfer function of the time optimal PLL (equation (3)) when n=1 and k=2. The operation unit of $Z^{-1}$ depends on a clock which may be applied at a particular time.

$$X(Z)=(2-Z^{-1})/(1-Z^{-1}) \qquad (3)$$

It should be noted that FIGS. 12 and 13 do not particularly illustrate the characteristic changing apparatus according to the present invention for the PLL. However, the characteristic changing apparatus 3C illustrated in FIGS. 5, 6 and 8 may be used for the PLL. In this example, the characteristic changing apparatus 3C, if employed, operates to change the sampling period as the time scale for the PLL, and to change the coefficient of the multiplier 12D.

Referring now to FIGS. 14(a) to 14(c), description will be given on the operation principles of an existing time optimal PLL. FIG. 14(a) shows a reference signal; FIG. 14(b) a follow-up signal; and FIG. 14(c) a difference in time between the reference signal and the follow-up signal. FIG. 14(a) shows the moment at which the period of the reference signal transitions from T1 to T2. As to the behavior of the follow-up signal in this event, the response shown in FIG. 14(b) is an optimal solution provided that no time lag or transient, possibly caused by a loop filter or the like, occurs. First, the follow-up side detects that the reference signal did not appear at a time at which it had estimated that the reference signal would be generated at the position of the period T1. The follow-up side, however, generates the follow-up signal in period T1. Here, the follow-up side starts measuring an error, and completes the detection of the error (T2-T1) as indicated in FIG. 14(c) after the period T2, as shown in FIG. 14(a). The time optimal PLL operates to estimate from the detection result that the period of the reference signal of FIG. 14(a) has changed to T2. Thus, the time optimal PLL controls the manipulated variable at the first step to extend the period to 2T2-T1 (the phase is first matched), and outputs the signal at the point of 2T2-T1. Then, at the next step, the time optimal PLL returns the manipulated variable to recover the period to T2 (matching the period), and outputs the signal at the point of period T2. The time optimal PLL is an extremely quick response follow system which can lock the PLL at the next sample point which is reached immediately after a shift of the reference signal is detected. However, since this technique does not have a loop filter for the PLL, it reacts extremely sensitive to fluctuations in the system and/or fluctuations in the reference signal and has the disadvantage in that resulting jitter becomes larger. The PLL circuit of the present invention can eliminate the disadvantage of the conventional time optimal PLL.

Figure 16:
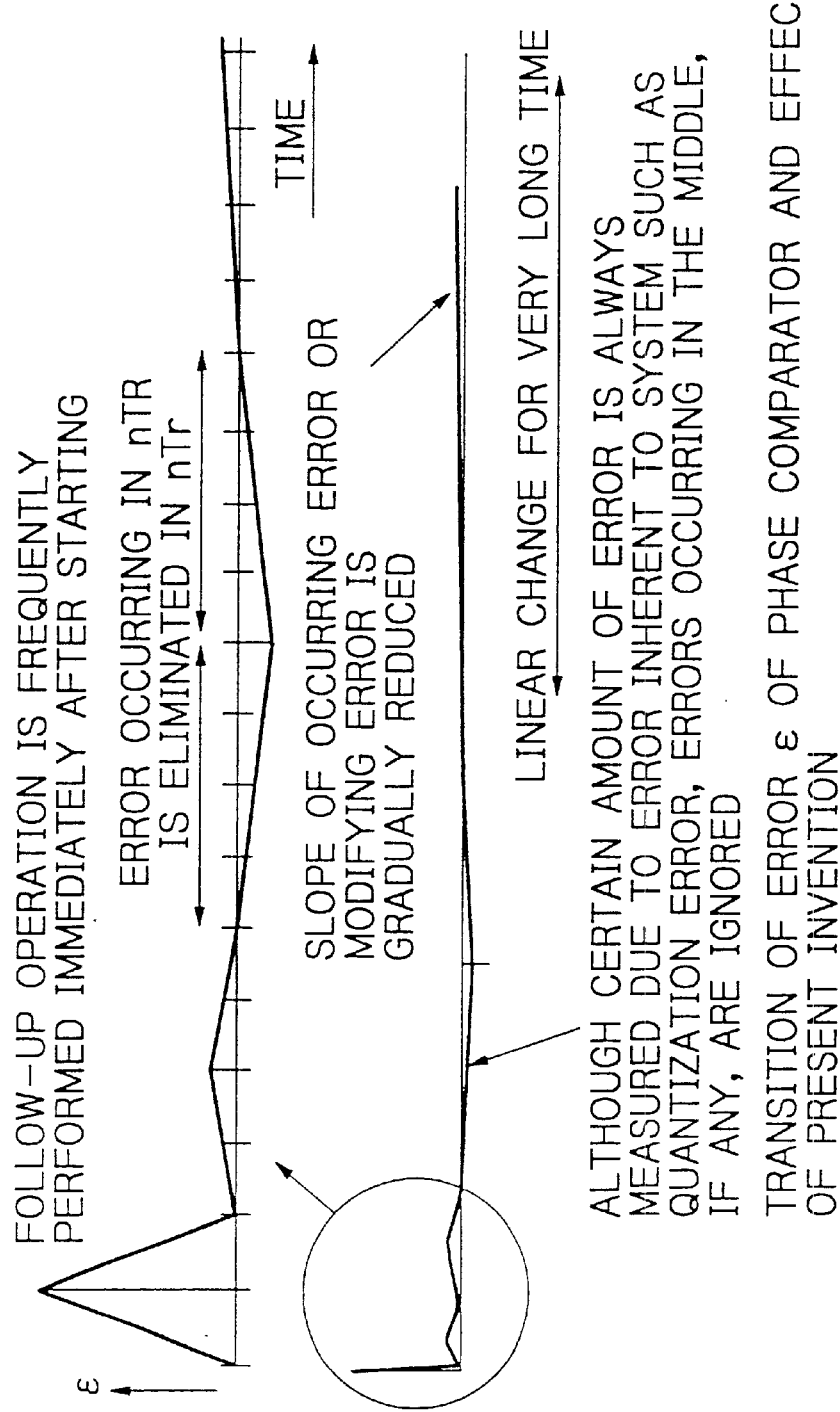
FIG. 16 is a diagram illustrating a change in the magnitude of the error $\epsilon$, corresponding to FIG. 15.

A change in the time scale, i.e., the sampling period will be described with reference to FIGS. 15 and 16. FIG. 15 shows the relationship among the deviation $\epsilon$, time scale coefficient n, and sampling period. FIG. 16 shows a change in the magnitude of an error corresponding to FIG. 15. Reference $T_R$ designates a reference period for an output of a phase comparator. First, since a large error is present immediately after the PLL starts the follow-up operation as illustrated in FIG. 16, the time scale coefficient n is set at one (initial value) (see the initial value setting output INIT in FIG. 8). In this event, a manipulated variable is determined such that an initial measurement error $\epsilon 1$ is eliminated ($\epsilon 1=0$) at the next sample point, as is the case with the operation of the time optimal PLL. Therefore, assuming that the system does not include any error, the phase is locked at time $T_R$. As the initial measurement error $\epsilon 1$ falls within an acceptable range, the value of the time scale coefficient n is increased (by the update command signal UC in FIG. 8). This update is, for example, an additive update as represented by n=n+1 (implemented by the increasing function circuit 300-31 in FIG. 8). This operation may be readily implemented by a counter. As is also illustrated in FIG. 16, since the time scale, i.e., the sampling period is increased by a factor of two when the time scale coefficient n is set to two (n=2), $\epsilon 2$ is measured at $2T_R$ intervals (every other sample). In this event, the follow-up signal can be controlled such that $\epsilon 2$ is eliminated ($\epsilon 2=0$) in $2T_R$ time, as is the case with the time scale coefficient n set to one (n=1). This can be readily accomplished by multiplication by ½ (for example, a shifter is available for this operation). From a viewpoint of the operation for control, it can be regarded that the following two stages are alternately performed:

Stage 1: measurement of an error with the reference signal; and

Stage 2: Elimination of the error in the shortest possible time.

Also, even if a slight error is present in the system, the PLL constitutes a feedback system as a whole, so that the error is converged in several sample periods, though not in the shortest time period.

One of key points of the PLL circuit according to the present invention lies in that the measured error $\epsilon$ is weighted by ½ such that the measured error $\epsilon$ is eliminated just in a period of $2T_R$. This means that fluctuations in error occurring in the period of $2T_R$ are eliminated in the period of $2T_R$, wherein the error is eliminated slowly in the same time period in which the error occurred. Similarly, the control operation is performed every third sample in a period of $3T_R$; very fourth sample in a period of $4T_R$; and every nth sample in a period of $nT_R$, wherein $\epsilon$ may be weighted using a 1/n multiplier.

While the foregoing update of the time scale coefficient n is an example of an additive update which starts with one and gradually increases one by one (n=n+1), a multiplicative update (n=2n) may be applied to the update of the time scale coefficient n for increasing the time scale coefficient n by a factor of 2's multiples. When such a multiplicative update is employed, the time scale coefficient n will take values represented by $n=2^q$ (q=0, 1, 2, . . . , m), the increasing function circuit 300-31 may be implemented by left-hand shifting, while the 1/n multiplier 12D may be implemented by right-hand shifting, resulting in the advantage of simplifying the apparatus. Alternatively, a selection sequence may be previously determined for the time scale coefficient n and stored in a lookup table stored in a memory, such that values in the table are sequentially selected from the lookup table.

While the foregoing operation is performed at intervals of $nT_R$, the error measurement in the state observation unit 320C (FIG. 5) may be performed every $T_R$ in order to quickly respond to an abrupt change in the reference signal (for example, a change in the frequency set value). In this case, the error is only monitored without changing the manipulated variable in measurements other than times $nT_R$, and the time scale coefficient n may be returned to a smaller value such as one (n=1) when the error exceeds a certain preset value (the time scale coefficient n is reduced by using the decreasing function circuit 300-32 in FIG. 8, or the initial value setting output INIT is used to set the time scale coefficient n to the initial value), to redo the follow-up operation.

The time scale coefficient n may be calculated by a phase comparator. When the error is measured at intervals of $T_R$ by the foregoing method, the error is only monitored without changing the manipulated variable until the error exceeds a certain preset value. In this event, a monitoring period m is counted (m=m+1). After monitoring the error for a while, the time scale coefficient n and the error ε are set for the controller 1D (n=m, ε=constant) at the time the error exceeds the preset value. After the time scale coefficient n is set, the monitoring period m is counted again from one.

In the PLL circuit in FIGS. 12 and 13 described above, the following modifications may also be made thereto. First, while the estimator 14D can produce the largest effect when its coefficient k is set at two, the coefficient k may be set at a value other than two depending on a particular object such as for taking into account a measurement error, or for intentionally failing to eliminate the error in the shortest possible time. Also, for a similar reason, $Z^{-1}$ need not be limited to a single element. In other words, a general PLL rather than the time optimal PLL can be used as the PLL. This means that the present invention is applicable to such modified implementations.

Next, the effects of the PLL circuit D using the time optimal PLL according to the present invention illustrated in FIGS. 12 and 13 will be described with reference to a table of FIG. 17. The table shows a distortion ratio (THD+N) when the PLL circuit D is operated in synchronism with a reference clock at 1 KHz to generate a PLL output clock at 16.9344 MHZ (44.1 KHz, 384 fs), and an audio D/A converter is operated using the resultant clock to generate a sinusoidal signal at 1 KHz. The degree of clock jitter significantly affects the performance of the analog output signal of the audio D/A converter. As can be seen from the table, the distortion of as much as 0.01% is observed when n=1, i.e., when the conventional time optimal PLL is used. However, the distortion is reduced by the application of the present invention as an update upper limit of the time scale coefficient n is gradually increased, and eventually reduced to an extremely small amount of 0.003% when n=1024 is applied. Seemingly, this is mainly because the frequency of the follow-up signal is not manipulated by the control system during a period $nT_R$. This demonstrates that extension of the sampling period can produce the same effect as if the sensitivity of a closed loop transfer function of the control system is reduced, and supports the effects of suppressing ripple fluctuations in the frequency deviation of the follow-up signal. Also, from the fact that the measurement of the error is equivalent to integrating the error for the period $nT_R$ and comparing the integration result with a reference value, the follow-up signal is less susceptible to the influence of fluctuations in the frequency of the reference signal.

For the measurement accuracy of the error ε, since effective digits can be shifted to the right in the 1/n multiplier, the measurement accuracy is increased as the value n is larger (the accuracy is increased by a factor of n). Specifically, immediately after the follow-up operation is started, the error measurement accuracy is low, however, the manipulated variable is frequently updated so that the response is extremely fast. Subsequently, as the time scale coefficient n is gradually updated, the accuracy is gradually increased, and the manipulated variable is updated at longer intervals in order to provide a high disturbance suppression capability.

Next, a variety of examples of modifications to the PLL circuit according to the fourth embodiment will be described with reference to FIGS. 18 to 26. FIG. 18 illustrates a variable frequency oscillator 20D which is an embodiment of the variable frequency oscillator 2D in FIG. 12. The illustrated variable frequency oscillator 20D is implemented by a local oscillator 200D; a mixer 202D having one of two inputs connected to the output of the local oscillator 200D; a drop/insertion timing generator 204D which receives the output from the controller 1D of FIG. 12 and the output of the local oscillator 200D; and a conventional analog PLL 206D which receives the output of the mixer 202D. The output of the drop/insertion timing generator 204D is connected to the other input of the mixer 202D. The analog PLL 206D, which constitutes a follow-up system per se, is configured to generate an oscillating signal synchronized with an input reference signal received by the PLL 206D. In the circuit configuration of the variable frequency oscillator 20D, the input of the analog PLL 206D is supplied with oscillating pulses from the local oscillator 200D through the mixer 202D. The mixer 202D drops or inserts oscillating pulses from the oscillator 200D in response to the output from the drop/insertion timing generator 204D to vary the frequency of the local oscillator 200D, thereby synchronizing the follow-up signal generated by the analog PLL 206D at its output with the reference signal.

The operation of the variable frequency oscillator 20D will now be described with reference to FIGS. 19(a)–19(c). FIG. 19(a) illustrates the oscillating pulses at a constant frequency generated by the local oscillator 200D. FIG. 19(b) illustrates the drop/insertion timing signal output by the drop/insertion timing generator 204D. The timing generator 204D receives a signal indicative of the oscillating frequency, which is the output of the controller 1C, and the oscillating pulses from the local oscillator 200D, and generates a timing output for dropping or inserting a pulse in accordance with the signal indicative of the oscillating frequency. As will be apparent to those skilled in the art, the timing generator 204D may be implemented in a variety of methods. For example, it may be implemented by a combination of a comparator and an AND gate (both not shown). The mixer 202D, which receives the timing output and the oscillating pulses, inserts one oscillating pulse when the timing output is a positive pulse, and drops one oscillating pulse when the timing output is a negative pulse, as illustrated in FIG. 19(c). As will be apparent to those skilled in the art, such a mixer may be implemented in a variety of methods. For example, the insertion of the oscillating pulse may be implemented by a combination of an oscillator for generating a signal at a frequency double the oscillating frequency of the local oscillator 200D, and a gate circuit (both not shown), while the drop of the oscillating pulse may be implemented by a gate circuit (not shown). Even with such insertion/drop of the oscillating pulse, a follow-up signal with suppressed jitter can be produced since the analog PLL 206D contains a loop filter and accordingly quite immune to the jitter of the input signal.

Figures 20A, 20B:
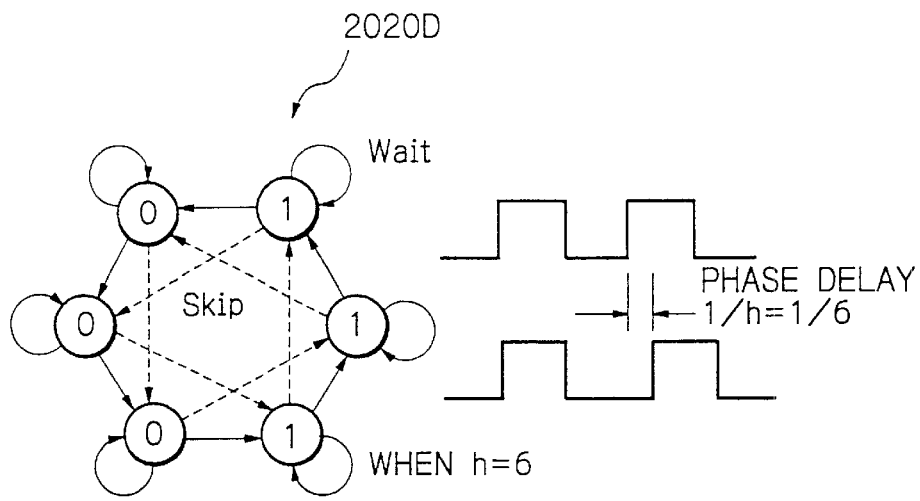
FIGS. 20(a) and 20(b) are diagram illustrating a mixer 2020D which is another embodiment of the mixer 202D illustrated in FIG. 18.

Next, another embodiment of the mixer 202D illustrated in FIG. 18 will be described with reference to FIGS. 20(a), 20(b). A mixer 2020D employs a technique of adjusting the phase of an output waveform in order to increase the accuracy thereof. FIG. 20(a) illustrates a state transition diagram for a mixer having h states. While FIG. 20(a) illustrates six states, the mixer may be designed to have any arbitrary number of states. Assuming herein that the mixer outputs "0" at a state (represented by a circle) denoted "0" and outputs "1" at a state denoted "1," the mixer outputs three "0's" and three "1's" in accordance with the frequency of the local oscillator in a normal condition. The drop/insertion timing generator 204D also employs the oscillating pulses of the local oscillator as an operating clock. The mixer transitions to WAIT to stop the state transition when a signal from the drop/insertion timing generator 204D (for example, the negative pulse in FIG. 19(b)) reaches. With the foregoing mechanism, the frequency of the output signal from the mixer 2020D can be delayed in phase by 1/h (⅙ in this embodiment). Conversely, the phase of the output signal can be advanced by the mixer 2020D skipping the state, as indicated by a dotted line in FIG. 20(a), in response to a signal from the timing generator 204D (for example, a positive pulse in FIG. 19(b)). By combining both mechanisms, the oscillating output can be generated at a variable frequency. When the operation for delaying the phase or the operation for advancing the phase is only required, one of the two mechanisms may only be used.

Figure 21:
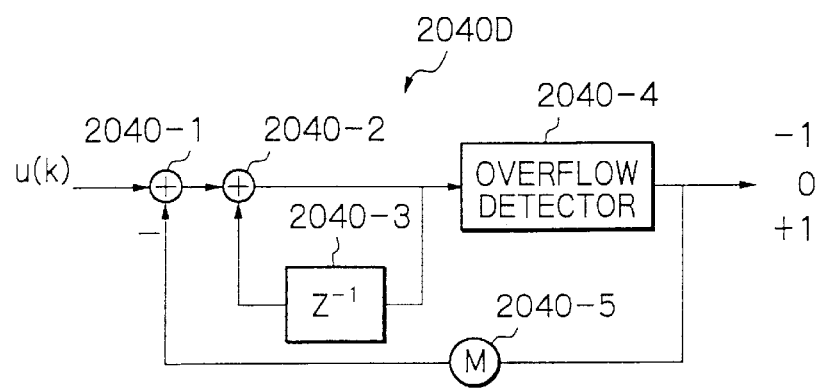
FIG. 21 is a block diagram illustrating a drop/insertion timing generator 2040D which is another specific embodiment of a drop/insertion timing generator 204D in FIG. 18.

Next, a more specific embodiment of the drop/insertion timing generator 204D in FIG. 18 will be described with reference to FIG. 21. The illustrated drop/insertion timing generator 2040D employs the oscillating pulses from the local oscillator 200D as an operating clock, calculates a difference between the operating clock and an output u(k) indicative of a target frequency generated by the controller 1D, and drops or inserts the number of pulses equal to the difference from or into the oscillating pulses from the local oscillator 200D at the most regular possible intervals. The timing generator 2040D is implemented by a modulo integrator which is composed of two adders 2040-1, 2040-2; a delay element 2040-3 and an overflow detector 2040-4 which receive the output of the adder 2040-2; and an M-times multiplier 2040-5, as illustrated. The first adder 2040-1 receives the output u(k) of the controller 1D at one input, and receives the output of the detector 2040-4 through the multiplier 2040-5 at the other input. The second adder 2040-2 receives the output of the adder 2040-1 at one input, and receives the output of the delay element 2040-3 at the other input. A loop inside the timing generator 2040D constitutes a simple integrator. The overflow detector 2040-4 behind the integrator outputs "−1," "0," "+1" depending on the value of a signal input to the overflow detector 2040-4. Specifically, the overflow detector 2040-4 outputs "+1" when the input signal is equal to or higher than a limit value M previously set therein (corresponding to the positive pulse in FIG. 19(b)); "−1" when the input signal is equal to or lower than a limit value −M previously set therein (corresponding to the negative pulse in FIG. 19(b)); and otherwise "0". Thus, the circuit operates as a modulo M multiplier which can be used to implement the aforementioned drop/insertion timing generator 204D. As another implementation alternative to the foregoing, a down counter and a divider may be employed, as will be readily understood by those skilled in the art. Further, the drop/insertion timing generator 2040D using a modulo integrator may be implemented in an analog sample value system or in a digital form.

Figure 22:
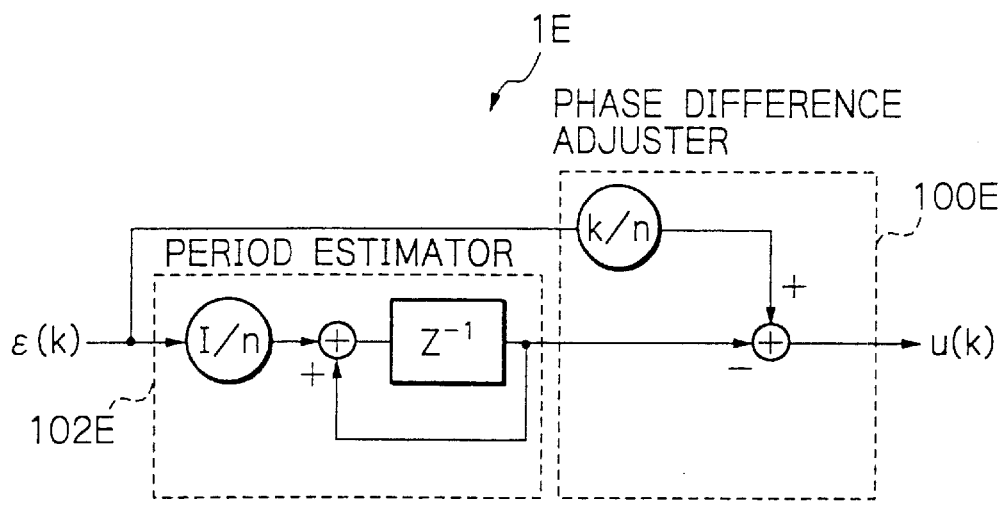
FIG. 22 is a diagram for explaining an approach for implementing a controller 1D of the time optimal PLL illustrated in FIG. 13 in a digital form.

Next, an approach for implementing the controller 1D of the time optimal PLL illustrated in FIG. 13 in a digital form will be described with reference to FIGS. 22 and 23. A controller 1E illustrated in FIG. 22 is a modification to the circuit configuration in FIG. 13. When the multiplier 12D and the multiplier (k) in the estimator 14D in FIG. 13 are rearranged, and the manipulated variable memory 10D positioned at the right end is moved to the left, the circuit configuration as illustrated in FIG. 22 results. It should be noted that a delay element $Z^{-1}$ of the manipulated variable memory 10D is inserted in the main line from ε(k) to u(k) (i.e., the preceding value is used in the manipulated variable memory 10D). The time optimal PLL operates in two stages, where the phase is matched first, and then the period is matched, as previously described with reference to FIG. 14, so that a right-hand portion of FIG. 22 is referred to as a phase difference adjuster 100E, and a left-hand portion of FIG. 22, which operates with one sample delay, is referred to as a period estimator 102E.

Figure 23:
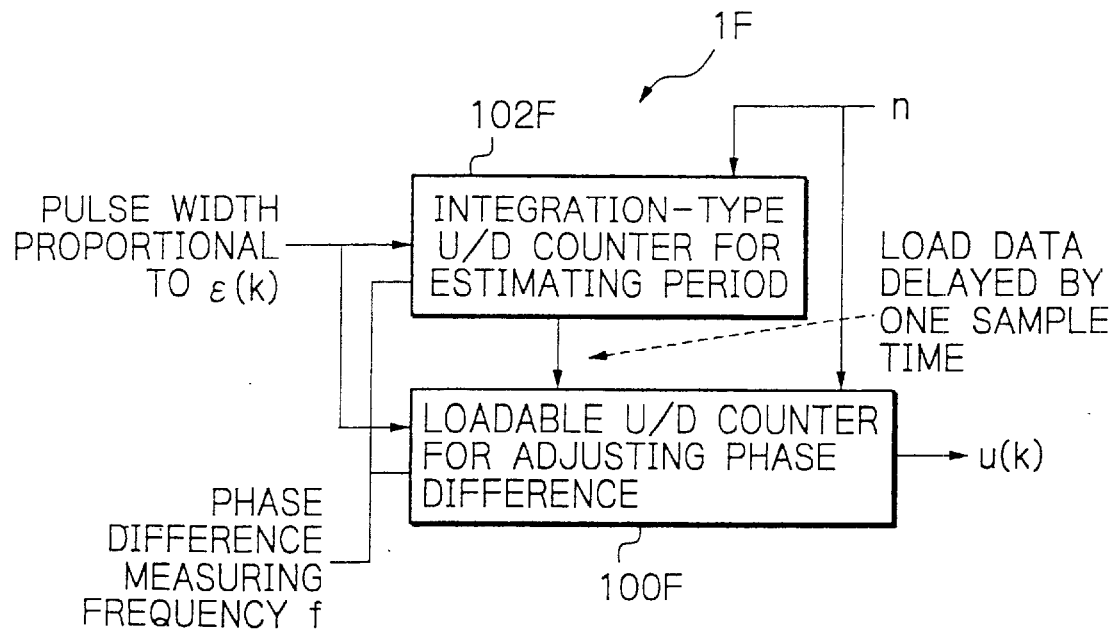
FIG. 23 is a block diagram illustrating a controller 1F which is an embodiment of the configuration illustrated in FIG. 22 using two up/down (U/D) counters.

FIG. 23 illustrates an embodiment which implements the configuration of FIG. 22 with two up/down (U/D) counters. The illustrated controller 1F comprises a loadable U/D counter 100F for phase difference adjustment, and an integration-type U/D counter 102F for period estimation. Both counters receive a pulse width signal proportional to ε(k) from the phase comparator 4D in FIG. 12 at their respective up/down inputs; receive a phase difference measuring frequency f as an operating clock input; receive a time scale coefficient n as a bit shift input; and a sampling clock (not shown) at their clock inputs. The integration type U/D counter 102F has a count output connected to a preset input of the loadable U/D counter 100F, and the output of the U/D counter 100F is delivered as u(k). Period estimation and phase difference adjustment in these U/D counters are performed by counting up (down) at the phase difference measuring frequency f, which is a sufficiently high frequency, while an up/down signal is output from the phase comparator 4D. In the sample value system, since signals between sample points are meaningless (values only at sampling times are meaningful), each of the loadable U/D counter 100F and the integration-type U/D counter 102F also performs the function of an associated adder illustrated in FIG. 22. In addition, the integration-type U/D counter 102F is configured not to reset a counting operation every sampling time, to perform an integration function (corresponding to the integrator in FIG. 22). Further, the integration-type U/D counter 102F performs an incremental/decremental counting operation by 1/n for realizing a weight of 1/n in the period estimator 102E.

Figure 24:
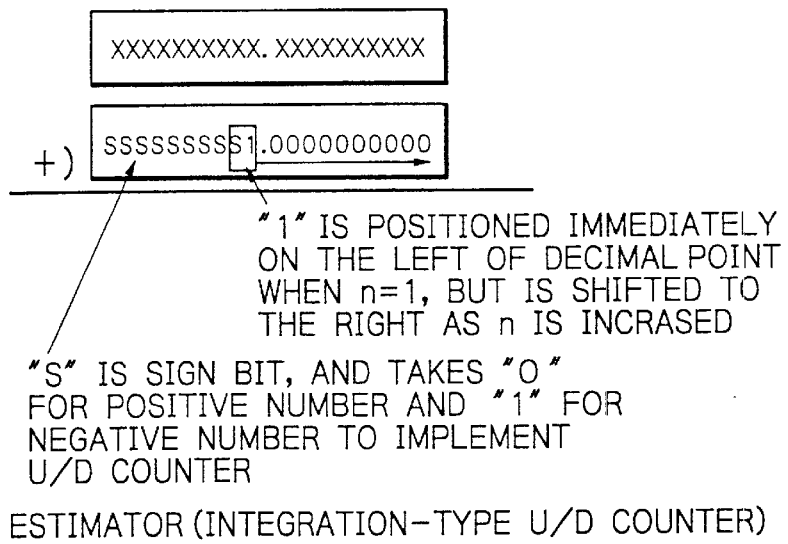
FIG. 24 is a diagram showing a method of performing a 1/n incremental/decremental counting operation in an integration-type U/D counter 102F in FIG. 23.

FIG. 24 illustrates the mechanism of the 1/n incremental/decremental counting operation. Since the integration-type U/D counter 102F is a device which increments or decrements by one (incrementer), the integration-type U/D counter 102F realizes the weight of 1/n by changing the position of the one ("1") in FIG. 24. When n=1, "1" is positioned immediately on the left of the decimal point. When n=2, "1" is shifted to the right by one bit. Similarly, when n=$2^q$, the one is shifted to the right by q bits. In addition, by filling the digit on the left side of "1" with a sign bit, an up counter and a down (2's complement) counter are realized. The sign bit s takes zero for a positive number and one for a negative number. While a similar operation is also performed in the loadable U/D counter 100F, the counter 100F multiplies by k/n.

Figure 25:
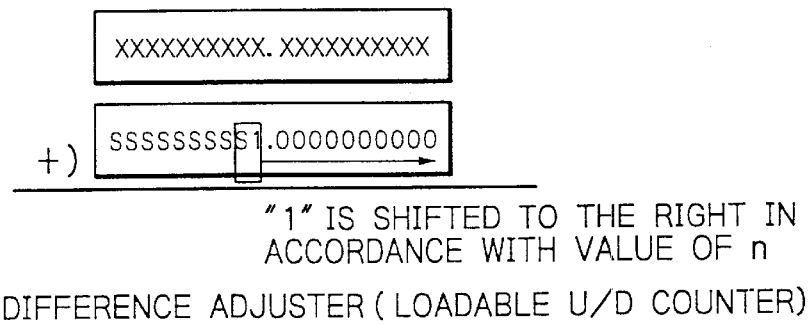
FIG. 25 is a diagram showing a method of performing a k/n multiplication in a loadable U/D counter 100F in FIG. 23.

Next, the k/n multiplication in the loadable U/D counter 100F will be described with reference to FIG. 25. Assuming herein that k is set at two (k=2), the following description is given to this particular case. As illustrated, for realizing a weight of 2/n, "1" is positioned at the second bit from the decimal point to the left, and the bits are shifted to the right by the value of n in response to the time scale coefficient n to perform a multiplication by 2/n, as is the case with FIG. 24. In this event, however, the sign bit takes zero for a negative number, and one for a positive number, i.e., reverse to the sign bit in FIG. 24. The counter 100F loads the operating result of the integrated U/D counter 102F every sampling time (implementing $Z^{-1}$ of one sample time lag). In FIGS. 24 and 25, "XXXXXXXX.XXXXXX" indicates a current count value of the counter.

As described above, as the value n becomes larger (n=$2^q$: q=0,1,2, . . . , r), the position of "1" in the incrementer is shifted to the right by q bits in both counters. This is important for understanding a significant advantage of the present invention. Specifically, according to the present invention, as the time scale coefficient n is progressively updated, a time required to measure the error becomes longer. This means that the evaluation of the error is performed by an integration-type estimator, which is effective in suppressing ripple fluctuations in the manipulated variable due to a varying error such as fluctuations in the system itself, an error introduced in a measured phase (including a quantization error in a digital implementation), and so on. Also, since the measured phase error becomes smaller relative to the period ($nT_R$), the same effect as an increased measurement accuracy can be produced. This fact can be explained using the aforementioned incrementer. Specifically, even with the same resolution for the frequency used for the phase difference measurement, since the addition digit is shifted to the right in the incrementer each time the time scale coefficient n is updated, so that the effective number of digits for an estimate, accumulated in the integration-type U/D counter 102F, is increased. As a result, the value set in the variable frequency oscillator 2D in FIG. 12 has a higher accuracy.

Figure 26:
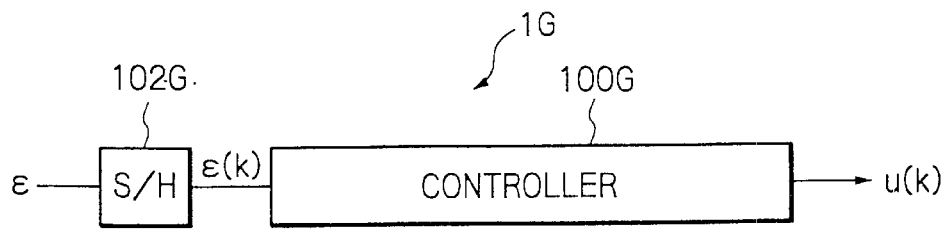
FIG. 26 is a block diagram illustrating a controller 1G which is another embodiment of the controller 1D of FIG. 12.

Next, FIG. 26 illustrates another embodiment of the controller 1D of FIG. 12. A controller 1G according to this embodiment comprises a sample/hold (S/H) circuit 102G between the output of the phase comparator 4D in FIG. 10 and a controller circuit 100G. The controller 1G can be used when the present invention is applied to a device of a continuous value system type. The provision of the sample/hold (S/H) circuit enables the continuous value system to be converted to a sample value system, so that the sample/hold circuit may be used to sample an incoming signal at certain time intervals (sampling frequency) to generate temporally discretized data which are used for a control. The term "discrete time" means that a temporally discontinuous data sequence is handled, and data itself may be digital or analog. The controller circuit 100G may be the controller 1D of FIG. 12; and the controllers 1E, 1F of FIGS. 22, 23. In this way, the present invention can be applied not only to a discretized value system but also to a continuous value system.

FIG. 33 shows a block diagram of a sampling period adaptive control tracking system 40, referred to as SPACT 40. Referring to FIG. 33, SPACT 40 receives a stable reference clock signal, i.e., 1 kHz, and from it generates a stable, very low jitter, rapidly synchronized master clock signal 38 of a much higher frequency, e.g. 44.1 kHz multiplied by a factor M. The master clock signal 38 is suitable as a substantially jitter-free clock input signal, for example in a delta sigma DAC of a USB interface system.

The reference clock signal is divided by a frequency divider 6 to produce a divided-down clock signal 21 which is applied to one input of a phase error detector circuit 4D. The other input of phase error detector circuit 4D receives a divided-down signal 35 from the output of a feedback divider circuit 18, the input of which receives the master clock signal 38. The error output 22 of phase error detector 4D is applied to the input of a gain controller 12D. Gain controller 12D is included in a controller 1D. The circuitry in block 15 constitutes a time-optimal controller. Block 1D is composed of several controllers, and constitutes the controller of SPACT 40. Time-optimal controller is block 15. The block 1D composed by several controllers is the whole controller of SPACT 40.

The controller 1D includes three controllers, time-optimal controller 15, adaptive controller 16 and gain controller 12D. The "control target" of proposed system is the time-optimal controller 15, which includes the frequency estimator of block 102E and the phase tuner of block 100E. The controller 1D also includes a loop filter circuit 15 which includes frequency estimator 102E having an input connected to an output 23 of gain controller 12D and also having an output 24 connected to an input of phase tuner 100E. The block 15 is called the loop filter circuit on a general PLL field. In this case, as the loop filter works on time-optimal condition the loop filter is also called the time-optimal controller.

The controller 1D also includes a "characteristic changing circuit" that includes adaptive controller circuit 16 and a state observer circuit 320C. State observer circuit 320C receives an information signal 26 indicative of the status of phase tuner 100E. State observer circuit 320C also receives the error signal 22 from the output of phase error detector circuit 4D and produces a status signal 27, which is applied as an input to adaptive controller circuit 16. Adaptive controller circuit 16 produces a timescale changing signal 28 which is applied to an input of loop filter circuit 15. Timescale changing signal 28 is applied to both frequency estimator 102E and phase tuner 100E.

Adaptive controller 16 also produces a transfer function changing signal 29 which is applied to a gain control input of gain controller 12D. The output 25 of phase tuner 100E is applied to an input of a digitally controlled oscillator 2D, the output of which constitutes the master clock signal on conductor 38. (The digital control circuit for controlling oscillator 2D is not shown.)

Gain controller 12D in FIG. 33 is the same as multiplier 12D in FIG. 13. The combination of the gain controller 12D and the frequency estimator 102E is the same as period estimator 102E in FIG. 22, and the combination of the gain controller 12D and the phase tuner 100E is also the same as phase difference adjuster 100E in FIG. 22. As previously explained, period (or frequency) estimator 102E can be implemented by means of previously described integration-type up/down (U/D) counter 102F of FIG. 23, and phase difference adjuster (phase tuner) 100E can be implemented by means of previously described loadable up/down counter 100F of FIG. 23 having its preset input connected to the output of U/D counter 102F.

Adaptive controller 16 is a combination of timescale changing processor 300C, transfer function changing unit 34C, and timescale generator unit 32C in FIG. 5. The adaptive controller 16 is constructed with the previously described function Ftfc of block 34C, the previously described function Ftsg of block 32C, and the previously described function Ftsc of block 300C in FIG. 5. The object of adaptive controller 16 and state observer 320C is to change the characteristics of time-optimal controller 15. This means changing the characteristics of the controller of SPACT 1D.

Signal 28 is used for changing the time scale, and signal 29 instructs gain controller 12D in order to adjust gain of transfer function of block 15 corresponding with the time scale of Signal 28.

State observer 320C estimates the extent of the adjustment from tracking error signal 22 and emergency signal 26 (for example, control signal over-flow or system failure).

As mentioned above, the system characteristics are changed by fitting the time constant of the control target, loop filter circuit 15. The key point of this idea is that time constant of loop filter circuit 15 can be changed by changing the time scale, i.e., the execution clock frequency or sampling frequency from phase error detector 4D. Another key point is that in order to get appropriate characteristics of "control target" loop filter circuit 15, the gain of the transfer function should be tuned by gain controller 12D.

While the present invention has been described for several embodiments, particularly in connection with PLL, it should be apparent to those skilled in the art from the foregoing description that the present invention can be applied not only to PLL but also to any arbitrary device for which a feed-forward control or feedback control is performed.

OTHER EXAMPLES OF APPLICABLE DEVICES

Several other examples of devices, to which the present invention can be applied, will be described with reference to FIGS. 27 to 30.

Figure 27A:
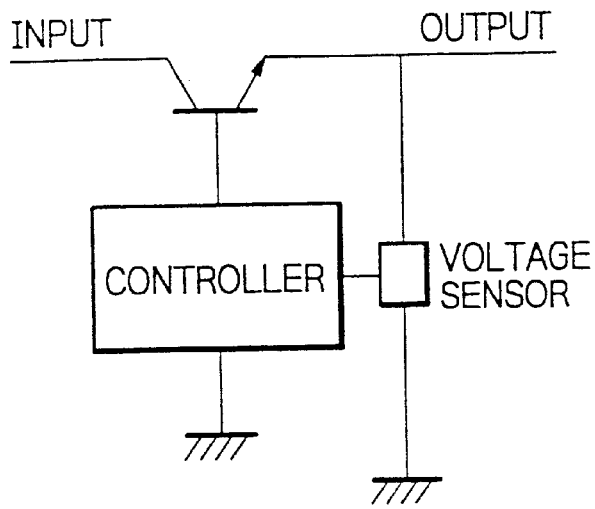
FIG. 27(a) is a block diagram illustrating a power supply regulator to which a controller according to the present invention is applied.
Figure 27B:
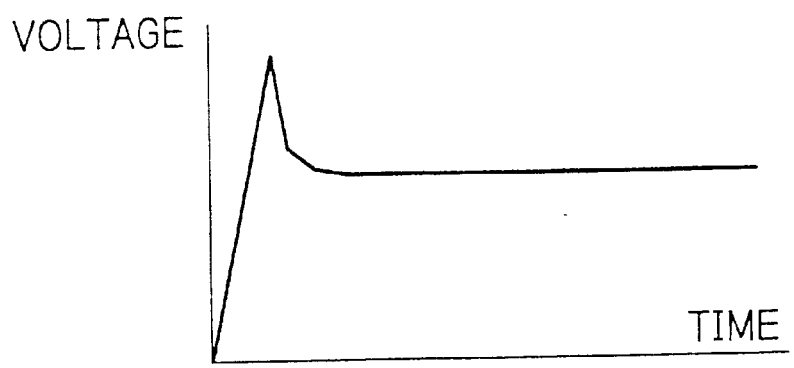
FIG. 27(b) is a graph illustrating the voltage versus time characteristic of the power supply regulator of FIG. 27(a)

FIG. 27(a) illustrates a power supply regulator to which a controller according to the present invention is applied. The power supply regulator is configured in such a manner that a voltage sensor senses an output voltage, and the controller of the present invention controls a voltage or a current at a base of a transistor in response to the sensed voltage. As illustrated in FIG. 27(b), control is used in the adjustment of the output voltage by the power supply regulator. Thus, by applying the present invention to this control, both quick response and stability can be substantially simultaneously realized for the output voltage adjustment in a single circuit. Particularly, when the present invention is applied to a regulator intended to generate a regulated current or a regulated voltage, the present invention has the advantage of adaptively changing the characteristics associated with an abrupt initial response and fluctuations due to disturbance.

Figure 28:
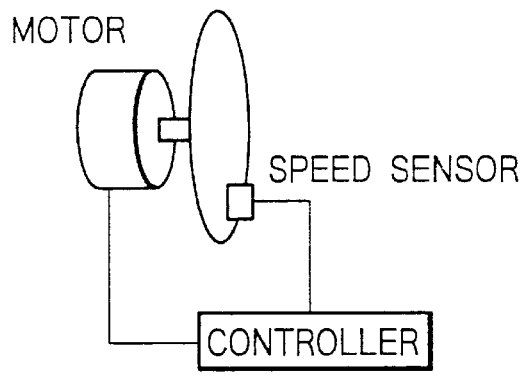
FIG. 28 is a block diagram illustrating another configuration of a controller according to the present invention applied to a control of rotation (speed) of a motor.

FIG. 28 illustrates another configuration of the present invention applied to a control of rotation (speed) of a motor. A controller according to the present invention receives an output from a sensor for sensing the rotation of the motor, and controls the motor in response to the sensor output. A controlled object may be a rotation control for HDD or drivers of DVD, CD and MD. While such a driver should control the motor to reach a constant speed as soon as possible, it is desired to control the motor to prevent fluctuations in rotation, once the constant speed is reached, in order to improve the reliability of data. In many cases with a control system having such contradictory objects as above, fluctuations in rotation at initial time may be ignored, and the initial response characteristic may be ignored during a constant speed rotation. The controller of the present invention can be readily applied also to such a system.

In some control systems adapted to control the speed or to aim at higher comfortability for an elevator, vehicles such as railway trains represented by the bullet train, it is necessary to meticulously change the sensitivity of the control system in accordance with varying conditions. Since the present invention has the capability of continuously changing the frequency characteristic in accordance with any conditions, such control systems will benefit from the present invention.

Figure 29:
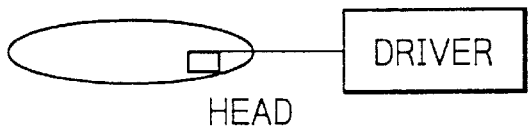
FIG. 29 is a diagram illustrating a position (servo) control system to which the present invention is applied.

FIG. 29 illustrates a position (servo) control system to which the present invention is applied. The controlled object is a head driver for the aforementioned HDD, a positioning apparatus for a robot arm, a stepper for use in manufacturing LSIs, and so on. A moving speed of such a head and so on dictates the system performance of the entire system. For example, the characteristics of a CD driver such as a seek time are critical factors directly related to the price, performance and so on of the apparatus. In such a tracking system, while a head should be moved to an instructed position as soon as possible, the head is desirably required to stably follow the control when information is read from the position. The head traces a trajectory on which a moving speed may linearly vary from a track to another depending on a radial direction or a specified position on a disc. It is therefore desired to adaptively control the movement of the head (speed of the movement, and so on) in accordance with the position of the head over the disc and a moving distance between tracks when a move command is issued. The present invention can be advantageously applied to such a system as well.

Figure 30:
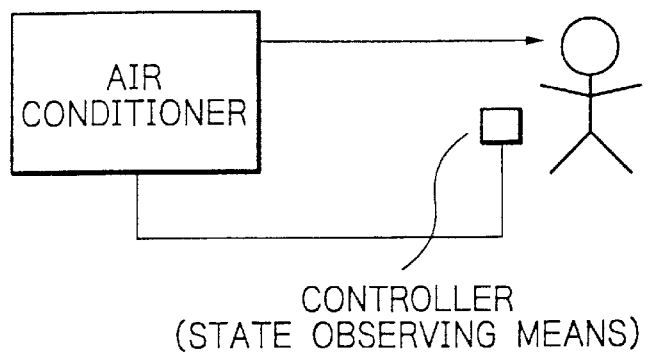
FIG. 30 is a diagram illustrating an application of the present invention to a control for a system which involves human's sense.
Figure 31A:
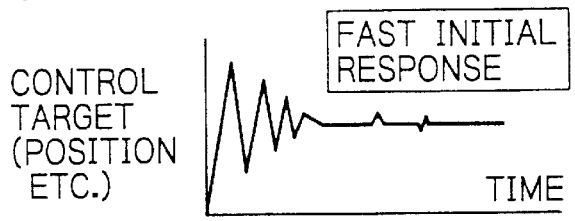
FIGS. 31(a) to 31(d) are graphs illustrating several examples of time response characteristics of control systems.
Figure 31B:
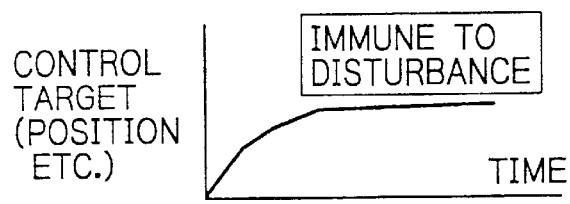
Figure 31C:
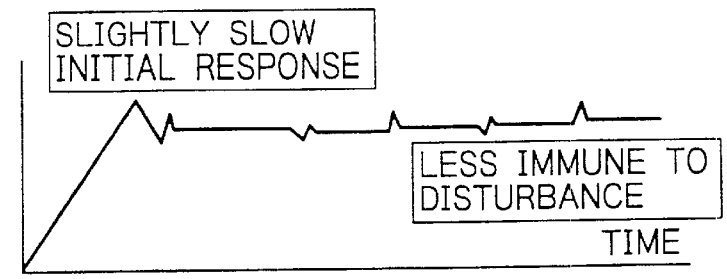
Figure 31D:
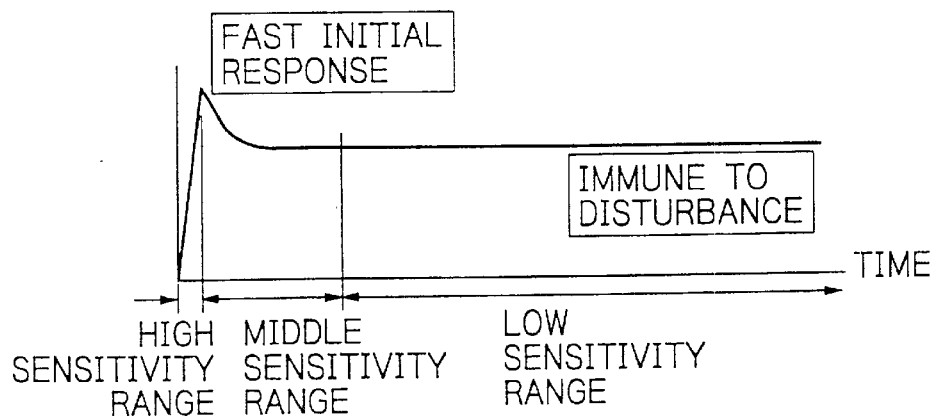

Finally, FIG. 30 illustrates a control when a system involves human's sense (psychiatric conditions). Taking into account, for example, a temperature control conducted by a fan heater, an air conditioner, or the like, it is necessary to control the amount of a heat source in accordance with the states of sensors. For example, a human may manipulate a temperature adjusting knob when he feels cold. In such a environment, there may be the need for varying the control characteristics in accordance with a variety of situations involving a temperature control conducted immediately after the manipulation on the knob, the comfort felt by the human (he will not change the adjusting knob in such a case), and so on. A human often expects an abrupt temperature change when he wants to change the temperature, even troubling himself to take an appropriate action therefor. Thus, there may be a system which is required to control the characteristics appropriate to an observed quantity to which a human or the like intervenes. It is therefore possible to apply the present invention to a system which may include elements other than machines, apparatus and so on in a control system. For observing psychiatric conditions of a human, the heart rate, blood pressure and so on may be employed.

As will be apparent from the foregoing description, the present invention is not at all limited to any particular device such as PLL or any particular field such as the field of electricity. Also, the present invention is not limited to any particular scale such as an electrical circuit. On the contrary, the present invention has an extremely wide range of applications.

According to the present invention described above in detail, the characteristics of a device such as the operation, response, performance and so on of the device can be changed using a parameter different from those typically employed in the prior art, i.e., a time scale. As a result, the present invention has the capability of changing the operation and so on of the device in a manner different from the prior art, and of realizing characteristics different from those previously employed in conventional devices, and characteristics which have not been able to developed in the prior art. For example, contradictory characteristics, which have been difficult or impossible to simultaneously realize in the prior art, can be realized substantially simultaneously or in a single apparatus. Particularly in the field of control, a novel design parameter, namely, the time scale can be used or added to existing parameters to realize a novel control scheme.

What is claimed is:

1. A device characteristic changing method comprising the steps of operating a device on a first time scale having a time scale coefficient to cause a characteristic of the device to have a first value, and then changing the characteristic by operating the device on a second time scale by updating a value of the time scale coefficient, wherein said characteristic is a time dependent characteristic, wherein said time dependent characteristic is an input/output response characteristic of said device, wherein said device is a controller for use in a control system for controlling a controlled object, and wherein said controller performs a feedforward control.

2. The device characteristic changing method of claim 1 wherein said changing the characteristic is performed while a transfer function of said device is maintained substantially constant.

3. The device characteristic changing method of claim 1 wherein said changing the characteristic is accompanied by changing of a transfer function of said device.

4. A device characteristic changing method according to claim 3, wherein said changing the characteristic is accompanied by changing of an element which affects a characteristic of said device other than said second time scale.

5. A device characteristic changing method according to claim 3, wherein said device operates on different time scales to have characteristic values which are substantially different from each other, said device being operable on a variable time scale.

6. The device characteristic changing method of claim 1 wherein said changing the characteristic is performed while a transfer function of said device is maintained substantially constant, and wherein said device includes a device in an electrical, mechanical, chemical or physical field.

7. The device characteristic changing method of claim 1 wherein said changing the characteristic is performed while a transfer function of said device is maintained substantially constant, and wherein said device operates in a digital form.

8. A device characteristic changing method according to claim 1, wherein said control device performs a feedback control.

9. The device characteristic changing method of claim 1 wherein said changing the characteristic is performed while a transfer function of said device is maintained substantially constant, and further comprising the step of determining a time scale of said device in response to a signal external to said device.

10. The device characteristic changing method of claim 1 wherein said changing the characteristic is performed while a transfer function of said device is maintained substantially constant, and further comprising the step of determining a time scale of said device in response to a signal internal to said device.

11. The device characteristic changing method of claim 1 wherein the transfer function of said device is maintained substantially constant irrespective of a change in a time scale.

12. The device characteristic changing method of claim 1 wherein said changing the characteristic is performed while a transfer function of said device is maintained substantially constant, and wherein a said time scale includes real time as the time scale.

13. The device characteristic changing method of claim 1 wherein said step of changing the characteristic of said device by changing a time scale on which said device operates includes changing a time scale in accordance with a predetermined sequence of time scales.

14. A device characteristic changing method according to claim 13, wherein said predetermined sequence of time scales is determined for an adaptive control for achieving different control targets.

15. A device characteristic changing apparatus for changing a characteristic of a device, comprising:

time scale generating means for generating a time scale having a time scale coefficient on which a device operates, and time scale changing means for changing said time scale by updating a value of the time scale coefficient, wherein said device has a first characteristic when it operates on a first time scale, and has a second characteristic when it operates on a second time scale, and wherein said characteristic is changed while maintaining a transfer function of said device substantially constant; and transfer function change compensating means for compensating a change in said transfer function resulting from a change in said time scale.

16. A device characteristic changing apparatus according to claim 15, wherein said characteristic is an input/output response which depends on the frequency of said device.

17. The device characteristic changing apparatus of claim 15 including time scale generating means for generating a time scale on which a device operates, and time scale changing means for changing said time scale, wherein said device has a first characteristic when it operates on a first time scale, and has a second characteristic when it operates on a second time scale, and wherein said changing of said characteristic is accompanied by changing of a transfer function of said device.

18. A device characteristic changing apparatus according to claim 15, wherein said device operates on different time scales to have substantially different characteristics from each other, said device being operable on a variable time scale.

19. A device characteristic changing apparatus according to claim 15, wherein said time scale changing means responds to a signal external to said device.

20. A device characteristic changing apparatus according to claim 15, wherein said time scale changing means responds to a signal internal to said device.

21. The device characteristic changing apparatus of claim 15 wherein said time scale changing means changes said time scale in accordance with a predetermined sequence of time scales determined for an adaptive control for achieving different control targets.

22. A method of controlling a controlled object in response to an input signal comprising the steps of:

generating a manipulated variable for said controlled object in response to said input signal in accordance with a predetermined transfer function including a time constant;

providing said transfer function by transfer element means included in a controller which is used in a control system for controlling said controlled object;

generating a state value representative of a state of said controlled object;

generating a time scale changing value from said state value using a predetermined time scale changing function; and changing said time constant of said transfer function in response to said time scale changing value.

23. A control method according to claim 22, wherein said step of generating a state value includes generating said state value of said controlled object by observing a state within said control system.

24. A control method according to claim 22, further including the step of compensating a change in said transfer function resulting from a change in said time constant to maintain said transfer function substantially constant.

25. A control method according to claim 22, wherein said control system is a PLL circuit.

26. A control method according to claim 22, wherein said PLL circuit is a time optimal PLL circuit.

27. A sampling period adaptive controlled tracking system, comprising:
  (a) a phase error detector having a first input coupled to a reference clock signal;
  (b) a controller including
    i. a gain controller having an input coupled to an error output signal produced by the phase error detector,
    ii. a frequency estimator having an input coupled to an output of the gain controller,
    iii. a phase tuner having an input coupled to an output of the frequency estimator,
    iv. a state observer circuit having a first input coupled to receive information regarding the phase tuner, and also having a second input coupled to the error output signal,
    v. an adaptive controller having in input coupled to an output of the state observer circuit, and producing a time scale signal coupled to the frequency estimator and the phase tuner, and also producing a transfer function changing signal coupled to a gain control input of the gain controller; and
  (c) a digitally controlled oscillator having an input coupled to an output of the phase tuner, and producing a master clock signal.

28. The sampling period adaptive controlled tracking system of claim 27 wherein the first input of the phase error detector is coupled to the reference clock by a first divider circuit.

29. The sampling period adaptive controlled tracking system of claim 28 wherein a second input of the phase error detector is coupled to the master clock signal by a second divider circuit.

30. The sampling period adaptive controlled tracking system of claim 27 wherein the frequency estimator includes an integration-type up/down counter for estimating a sampling period, and wherein the phase tuner includes a loadable up/down counter for adjusting a phase difference.

31. The device characteristic changing method of claim 1 wherein the changing of the characteristic is performed without changing any physical parameter determinative of the characteristic.

* * * * *